US006909631B2

(12) United States Patent
Durlam et al.

(10) Patent No.: US 6,909,631 B2
(45) Date of Patent: Jun. 21, 2005

(54) MRAM AND METHODS FOR READING THE MRAM

(75) Inventors: Mark A. Durlam, Chandler, AZ (US);
Thomas W. Andre, Austin, TX (US);
Mark F. DeHerrera, Tempe, AZ (US);
Bradley N. Engel, Chandler, AZ (US);
Bradley J. Garni, Austin, TX (US);
Joseph J. Nahas, Austin, TX (US);
Nicholas D. Rizzo, Gilbert, AZ (US);
Saied Tehrani, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 98 days.

(21) Appl. No.: 10/679,134

(22) Filed: Oct. 2, 2003

(65) Prior Publication Data

US 2004/0125649 A1 Jul. 1, 2004

Related U.S. Application Data

(63) Continuation-in-part of application No. 10/331,058, filed on Dec. 27, 2002.

(51) Int. Cl.$^7$ ............................................. G11C 11/14
(52) U.S. Cl. ...................................... 365/158; 365/173
(58) Field of Search ................................ 365/158, 157, 365/171, 173

(56) References Cited

U.S. PATENT DOCUMENTS

| | | | |
|---|---|---|---|
| 3,984,815 A | 10/1976 | Drexler et al. | 377/20 |
| 4,805,146 A | 2/1989 | Bruder et al. | 365/131 |
| 5,640,343 A | 6/1997 | Gallagher et al. | 365/171 |
| 5,702,831 A | 12/1997 | Chen et al. | 428/611 |
| 5,734,605 A | 3/1998 | Zhu et al. | 365/173 |
| 5,793,697 A | 8/1998 | Scheuerlein | 365/230.07 |
| 5,894,447 A | 4/1999 | Takashima | 365/158 |
| 6,055,178 A | 4/2000 | Naji | 365/158 |
| 6,081,446 A | 6/2000 | Brug et al. | 365/171 |
| 6,097,626 A | 8/2000 | Brug et al. | 365/171 |
| 6,111,783 A | 8/2000 | Tran et al. | 365/171 |
| 6,128,239 A | 10/2000 | Perner | 365/209 |
| 6,191,972 B1 * | 2/2001 | Miura et al. | 365/171 |
| 6,205,073 B1 | 3/2001 | Naji | 365/209 |
| 6,256,224 B1 | 7/2001 | Perner et al. | 365/173 |
| 6,256,247 B1 | 7/2001 | Perner | 365/209 |
| 6,259,644 B1 | 7/2001 | Tran et al. | 365/209 |

(Continued)

OTHER PUBLICATIONS

K.T.M. Ranmuthu, I.W. Ranmuthu, A.V. Pohm, C.S. Comstock, M. Hassoun, "10–35 Nanosecond Magneto–Resistive Memories", IEEE Transactions on Magnetics, vol. 26, No. 5, Sep. 1990, Engineering Research Institute, Iowa State University.

I.W. Ranmuthu, K.T.M. Ranmuthu, C. Kohl, C.S. Comstock, M. Hassoun, "A 512K–Bit Mageneto Resistive Memory with Switched Capacitor Self–Referencing Sensing", IEEE Transactions on Circuits and Systems–II, Analog and Digital Signal Processing, vol. 39, No. 8, Aug. 1992.

*Primary Examiner*—Tan T. Nguyen
(74) *Attorney, Agent, or Firm*—Ingrassia, Fisher & Lorenz

(57) ABSTRACT

An MRAM is provided that minimizes the limits in MRAM density imposed by utilization of an isolation or select device in each memory cell. In addition, methods are provided for reading an MTJ in a ganged memory cell of the MRAM. The method includes determining an electrical value that is at least partially associated with a resistance of a ganged memory cell of the MRAM. The MTJ in the ganged memory cell is toggled and a second electrical value, which is at least partially associated with the resistance of the ganged memory cell, is determined after toggling the MTJ. Once the electrical value prior to the toggling and after the toggling is determined, the difference between the two electrical values is analyzed to determine the value of the MTJ.

31 Claims, 15 Drawing Sheets

U.S. PATENT DOCUMENTS

| | | |
|---|---|---|
| 6,331,943 B1 | 12/2001 | Naji et al. .................. 365/158 |
| 6,365,419 B1 | 4/2002 | Durlam et al. ................. 438/3 |
| 6,545,906 B1 | 4/2003 | Savtchenko et al. ........ 365/158 |
| 6,738,303 B1 * | 5/2004 | Subramanian et al. ...... 365/209 |
| 6,791,868 B2 * | 9/2004 | Gider et al. ................. 365/158 |
| 2002/0037595 A1 | 3/2002 | Hosotani |
| 2002/0097598 A1 | 7/2002 | Hoenigschmid |
| 2003/0161197 A1 * | 8/2003 | Iwata et al. ................. 365/200 |

* cited by examiner

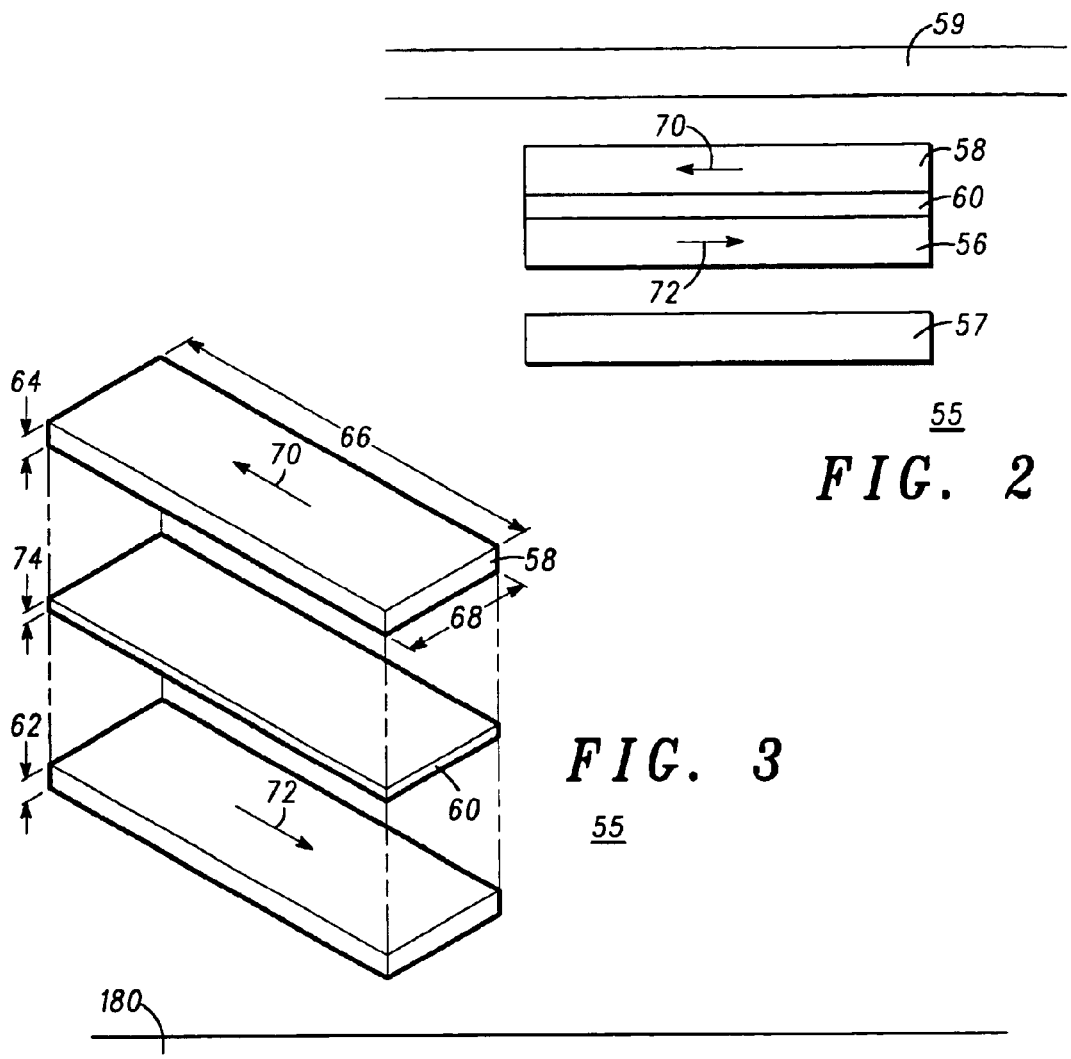
FIG. 2
FIG. 3
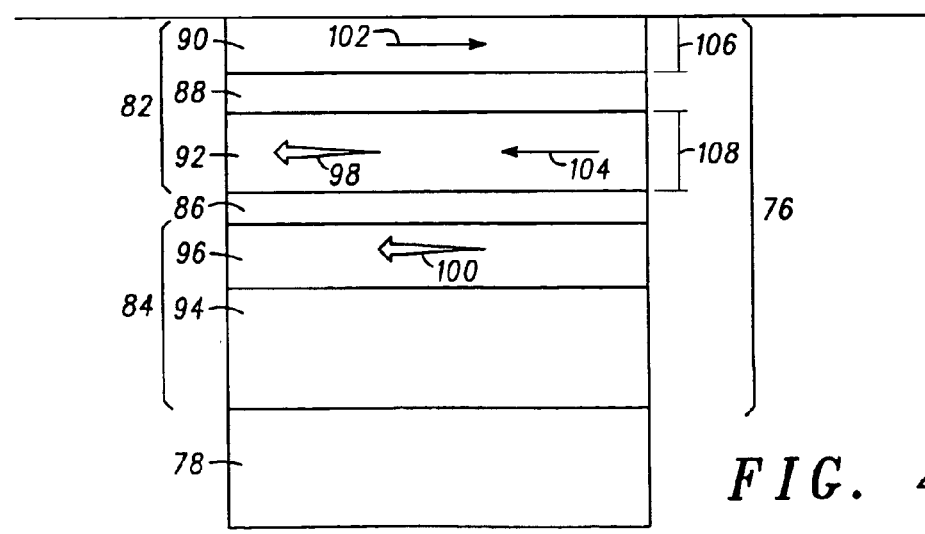
FIG. 4

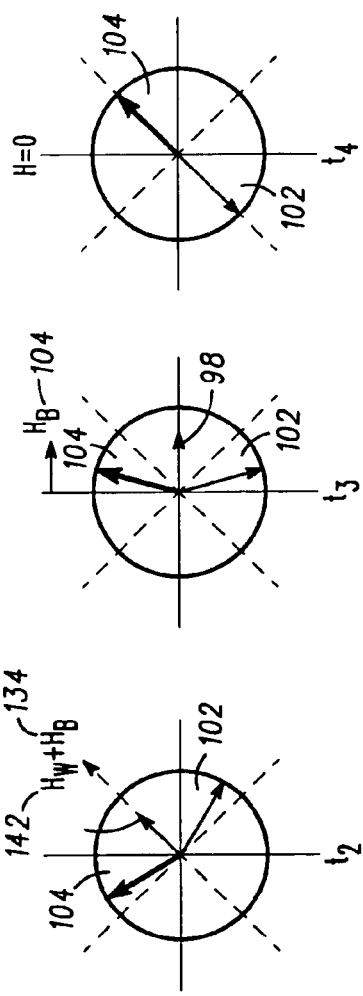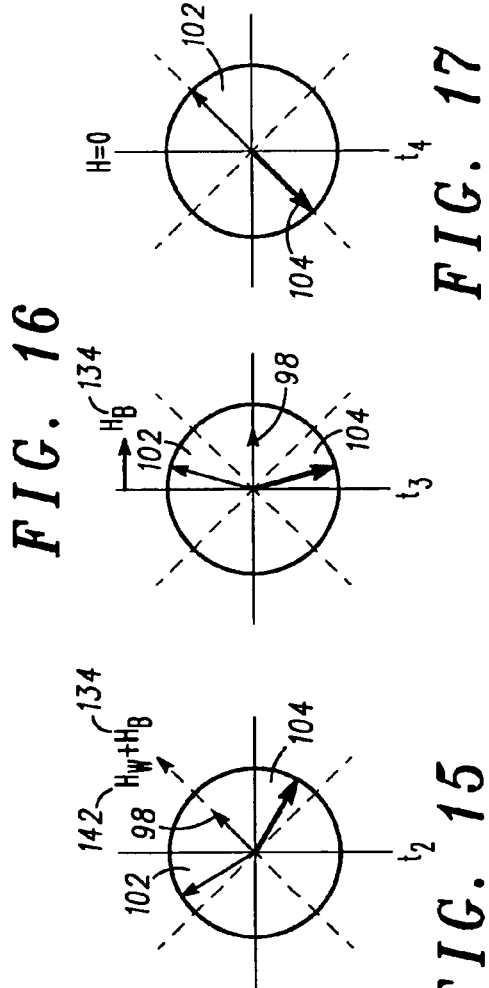

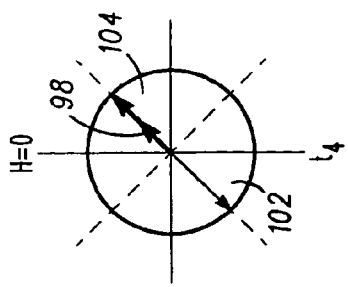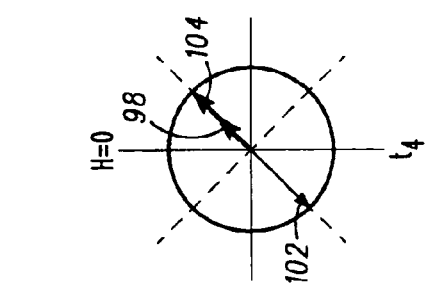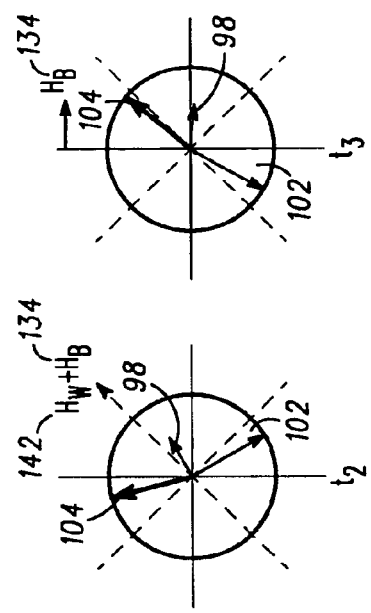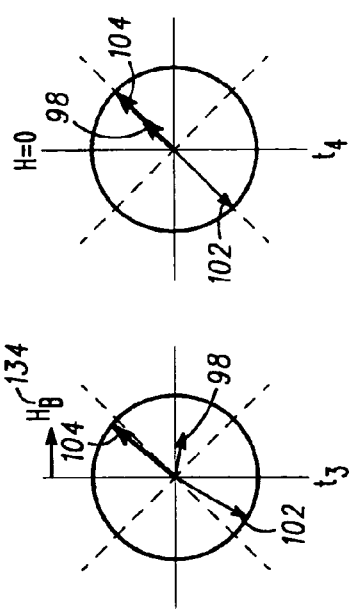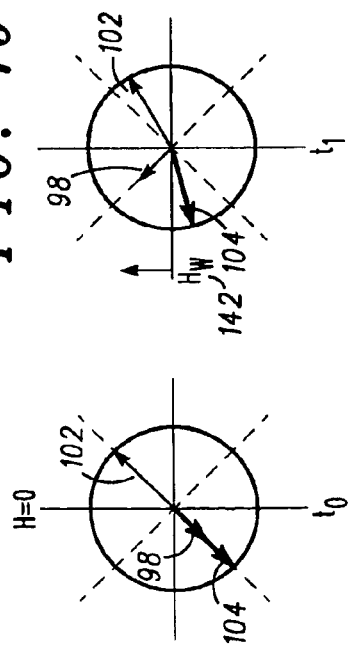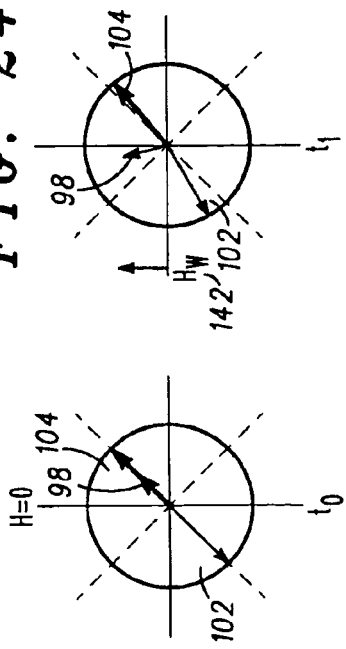

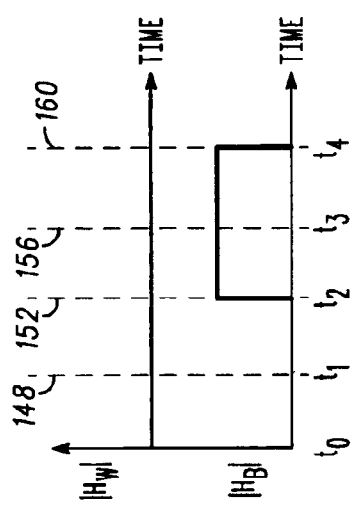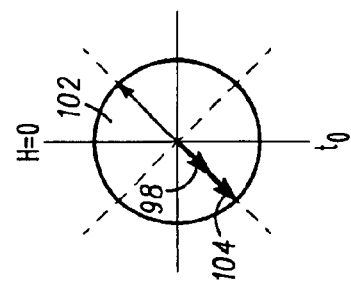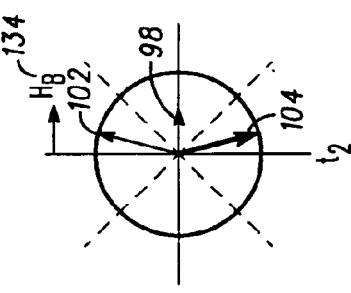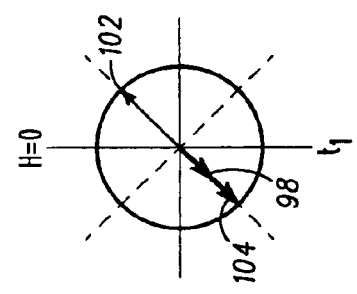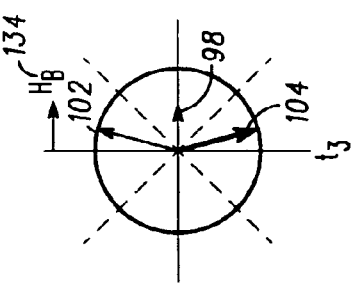

MRAM AND METHODS FOR READING THE MRAM

CROSS-REFERENCES TO RELATED APPLICATIONS

This is a continuation-in-part of U.S. application Ser. No. 10/331,058, filed Dec. 27, 2002.

TECHNICAL FIELD

The present invention generally relates to a Magnetoresistive Random Access Memory (MRAM), and more particularly to an MRAM with Magnetic Tunnel Junctions (MTJs) and methods for reading an MTJ of the MRAM.

BACKGROUND

Magnetoelectronics, spin electronics and spintronics are synonymous terms for the use of effects predominantly caused by electron spin. Magnetoelectronics is used in numerous information devices, and provides non-volatile, reliable, radiation resistant, and high-density data storage and retrieval. The numerous magnetoelectronics information devices include, but are not limited to MRAM.

MRAM is generally composed of magnetoresistive memory cells, word lines, and bit lines intersecting the word lines. The memory cells are typically formed with a Magnetic Tunnel Junction (MTJ). In addition, each of the memory cells is typically formed with an isolation or select device that is configured to electrically isolate the memory cell from other memory cells when reading the magnetization state or value of the memory cell. For example, each of the memory cells is typically formed with an isolation transistor, such as a Metal Oxide Field Effect Transistor (MOSFET), which can be configured to electrically isolate the memory cell from other memory cells in the memory. Utilization of an isolation device, such as an isolation transistor, in each memory cell limits the cell density, and MRAMs with increased cell densities are continually sought. Accordingly, it is desirable to reduce the limits in MRAM cell density imposed with an isolation or select device in each memory cell, such as an isolation transistor in each memory cell.

In view of the foregoing, it is desirable to provide an MRAM having one or more memory cells that are formed without an isolation device, such as an isolation transistor. In addition, it is desirable to provide an MRAM with memory cells that only include an MTJ. Furthermore, it is desirable to provide methods for reading an MTJ in an MRAM. It is also desirable to improve the memory array efficiency, a metric that measures the amount of area devoted to the memory, which is compared to the overall die or circuit size that includes peripheral circuitry used to perform addressing, reading, interfacing to other logic circuits either on chip or off-chip. For example, the array efficiency of FLASH memory has been decreasing as a result of supply voltage scaling while charge pump circuitry requirements are inversely scaling with supply voltage. Moreover, other desirable features and characteristics of the present invention will become apparent from the subsequent detailed description and the appended claims, taken in conjunction with the accompanying drawings and this background.

BRIEF DESCRIPTION OF THE DRAWINGS

The present invention will hereinafter be described in conjunction with the following drawing figures, wherein like numerals denote like elements.

FIG. 2 is a simplified side view of an MTJ in accordance with a first exemplary embodiment of the present invention;

FIG. 3 is a exploded view of the MTJ illustrated in FIG. 2;

FIG. 4 is a simplified side view of an MTJ in accordance with a second exemplary embodiment of the present invention;

FIGS. 8–12 illustrate the movement of the magnetic moments during a toggle write that results in a change from a first binary value to a second binary value;

FIGS. 13–17 illustrate the movement of the magnetic moments during a toggle write that results in a change from the second binary value to the first binary value;

FIGS. 18–22 illustrate the movement of the magnetic moments during a direct write that results in a change from a first binary value to a second binary value;

FIGS. 23–27 illustrate the movement of the magnetic moments during a direct write of the first binary value with the MTJ of FIG. 4 already in the orientation that provides the first binary value when the direct write commences;

FIGS. 28–32 illustrate the movement of the magnetic moments during application of a single magnetic field sequence shown in FIG. 33;

FIG. 33 is a timing diagram for application of a single magnetic field to the MTJ of FIG. 4;

DETAILED DESCRIPTION

The following detailed description of the invention is merely exemplary in nature and is not intended to limit the invention or the application and uses of the invention. Furthermore, there is no intention to be bound by any expressed or implied theory presented in the preceding technical field, background or the following detailed description and accompanying drawings.

Figure 1:
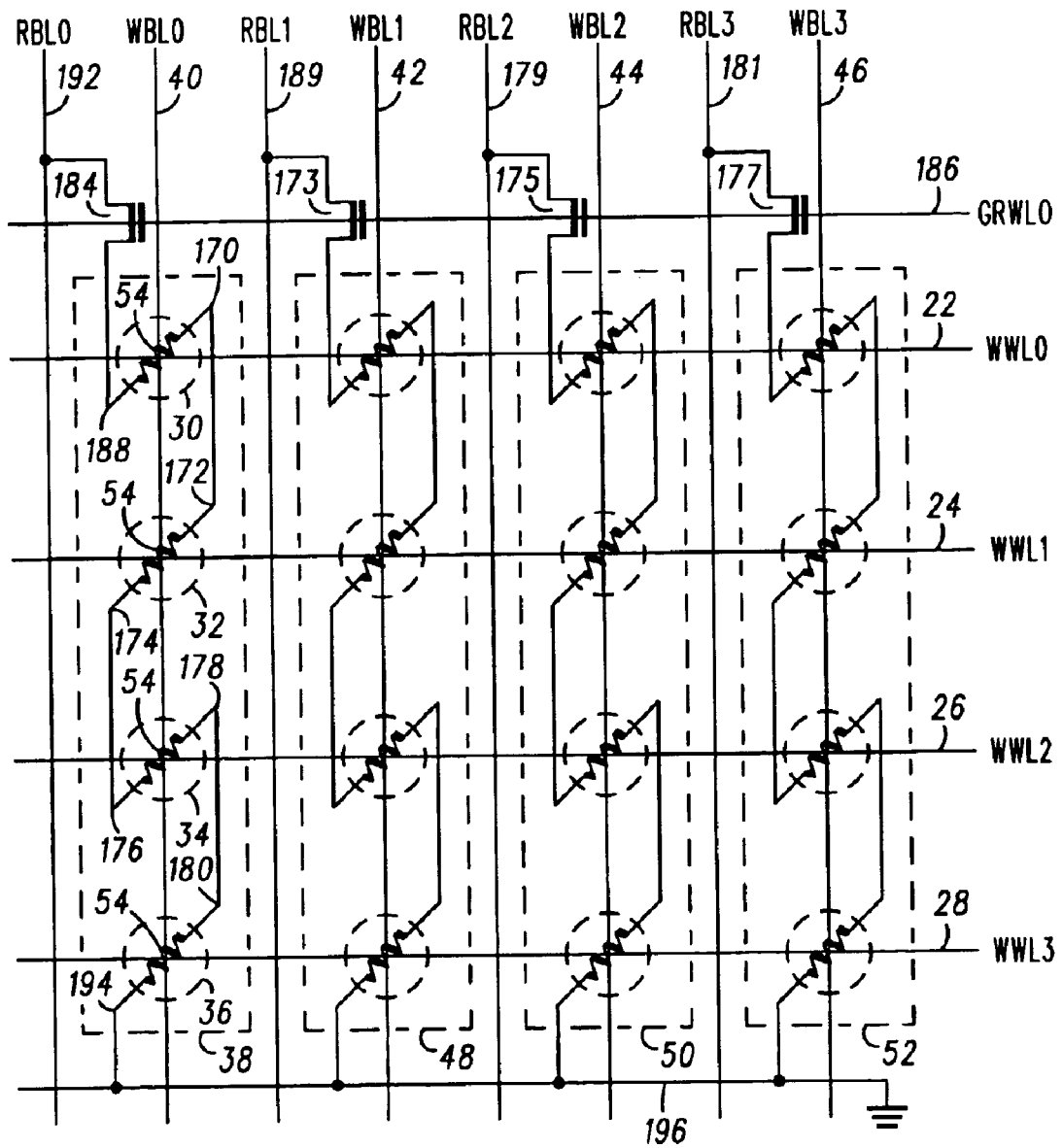
FIG. 1 is a schematic diagram of an MRAM in accordance with a first exemplary embodiment of the present invention.

Referring to FIG. 1, an MRAM 20 is illustrated in accordance with a first exemplary embodiment of the present invention. The MRAM 20 includes at least a first write word line (WWL) 22 and preferably includes write word lines (24,26,28) in addition to the first write word line 22. The MRAM 20 also includes at least a first memory cell 30 adjacent to the first write word line 22 and a second memory cell 32 coupled to the first memory cell 30. As used herein, adjacent shall mean near, close or in actual contact to enable magnetic coupling.

A first end 188 of the first memory cell 30 is coupled to a transistor 184. A second end 170 of the first memory cell 30 is coupled to a second end 172 of the second memory cell 32, a first end 174 of the second memory cell 32 is coupled to a first end 176 of third memory cell 34, a second end 178 of the third memory cell 34 is coupled to a second end 180 of a fourth memory cell 36 and a first end 194 of the fourth memory cell 36 is coupled to a ground connect 196. Thus, the memory cells (30,32,34,36) are coupled (e.g., electrically coupled end-to-end) to form a first ganged memory cell 38, and preferable series coupled to form the first ganged memory cell 38. As used herein, a ganged memory cell shall mean multiple memory cells that can be substantially electrically isolated as a whole from other memory cells of the memory. In addition to the one or more write word lines (22,24,26,28) and the one or more memory cells (30,32,34,36) coupled to form the first ganged memory cell 38, the MRAM 20 includes at least a first bit write line 40 adjacent to the first memory cell 30 and more preferably adjacent to each of the memory cells (30,32,34,36) of the first ganged memory cell 38. Furthermore, additional write bit lines (42,44,46) are preferably included in the MRAM 20 that are adjacent to at least one memory cell of other ganged memory cells (48,50,52). Moreover, a transistor 184 is coupled to a read bit line 192 and group read word line (GRWL) 186 is coupled to a control electrode of a group read isolation transistor 184. Similarly, group read isolation transistors (173,175,177) are controlled by the group read word line 186, which couples a first end of the ganged memory cells (38,48,50,52) to read bit lines (192,189,179,181). While four (4) memory cells (30,32,34,36), four ganged memory cells (38,48,50,52), four write bit lines (40,42,44,46) and four write word lines (22,24,26,28), four read bit lines (192,188,178,180) and a single group read word line 186 are illustrated in this first exemplary embodiment and subsequently described exemplary embodiments, the MRAM 20 can have more than four (4) and less than four (4) memory cells, ganged memory cells, bit lines and/or word lines and more than one (1) group read word line.

At least one memory cell of the first ganged memory cell 38, such as the second memory cell 32, is formed with an MTJ 54 that is depicted as a resistor, and at least one memory cell is formed without an isolation device, which at least substantially electrically isolates the memory cell from the other memory cells (30,34,36) of the first ganged memory cell 38 (e.g., an isolation device, such as an isolation transistor). Preferably, more than one of the memory cells (30,32,34,36) is formed with an MTJ 54 and without a device that electrically isolates the memory cell from the other memory cells of the ganged memory cell 38, and more preferably each of the memory cells is formed with an MTJ 54 and without a device that electrically isolates the memory cell from the other memory cells of the first ganged memory cell 38. Even more preferably, at least one of the memory cells (30,32,34,36) consists of an MTJ (i.e., the memory cell only has an MTJ, no more or no less), and most preferably each of the memory cells of the first ganged memory cell 38 consists of an MTJ 54. Furthermore, other ganged memory cells (48,50,52) shown in the figures and other memory cells of the MRAM that are not shown in the figures are preferably configured as previously described with reference to the first ganged memory cell 38. Therefore, at least N memory cells can be coupled (e.g., electrically coupled end-to-end) and electrically isolated from other memory cells (e.g., selected) with M isolation devices, where N and M are integers and N is greater than M (i.e., N>M), and multiple memory cells are more preferably coupled and electrically isolated from other ganged memory cells with one isolation device.

Referring to FIG. 2, a simplified side view is provided for a first exemplary MTJ 55 that is interposed between a write word line 57 and a write bit line 59. The MTJ 55 has two magnetic regions (56,58) that are ferromagnetically coupled and separated by a tunnel barrier region 60. The magnetic regions (56,58) can be single or multi-layers of ferromagnetic materials such as nickel (Ni), iron (Fe), cobalt (Co), or alloys or combinations thereof (e.g., nickel iron (NiFe), cobalt iron (CoFe) and nickel iron cobalt (NiFeCo)), including alloys having manganese (Mn), iridium (Ir), palladium (Pd) or platinum (Pt) therein. The tunnel barrier region 60 is preferably formed of one or more non-conductive materials such as ($Al_2O_3$), hafnium oxide ($HfO_2$), Boron oxide ($B_2O_3$), tantalum oxide ($Ta_2O_5$), zinc oxide ($ZnO_2$) and other oxides, nitrides, or other suitable dielectrics.

Although the example of the MTJ 55 is presented with two magnetic regions (56,58), the MTJ 55 can have more than two magnetic regions. The two or more magnetic regions (56,58) can be rectangular and formed with the easy axis of magnetization along a length 66 rather than a width 68. However, the magnetic regions (56,58) can have other shapes and an easy-axis formed along other dimensions of the MTJ 55. For example, the MTJ 55 can have a circular, elliptical or oval shape.

The MTJ 55 can be operated in any number of modes. For example, the MTJ 55 can be operated in an anti-ferromagnetic mode and a spin valve mode. In the anti-ferromagnetic mode, the resting magnetization states or resting orientation between the magnetic moments of the two magnetic regions (56,58) are at least substantially anti-parallel or at least substantially parallel. In the spin valve mode, one of the magnetic regions (56,58) is a pinned magnetic region and the other magnetic region is a free magnetic region that can be switched to provide either parallel or anti-parallel orientation between the magnetic moments of the free magnetic region and the pinned magnetic region (i.e., one of two magnetization states). As used herein, a free magnetic region shall mean a magnetic region with a resultant magnetic moment that is free to rotate in the presence of applied magnetic fields and a pinned or fixed magnetic region shall mean a magnetic region with a resultant magnetic moment that does not typically rotate in the presence of the applied magnetic fields that rotate the resultant magnetic moment of the free magnetic region.

Referring to FIG. 2 and FIG. 3, the separation of the magnetic regions (56,58) with the tunnel barrier region 60 produces a tunneling junction in which the relative orientation between the magnetic moments (70,72) (i.e., the magnetization state) affects the measurable resistance of the MTJ 55. Therefore, as the orientation between the magnetic moments (70,72) of the magnetic regions (56,58) changes, the resistance of the MTJ 55 changes, and the different resistances associated with the different orientations (i.e., different magnetization states) can be assigned any number of values. For example, the values of the MTJ 55 are binary values (i.e., 0 or 1) in accordance with an exemplary embodiment of the present invention. One of the binary values corresponds to a substantially parallel orientation between the magnetic moments (70,72) (i.e., a first magnetization state) and the other binary value corresponds to a substantially anti-parallel orientation between the magnetic moments (70,72) (i.e., a second magnetization state). The resistance of the MTJ 55 with the substantially anti-parallel orientation between the magnetic moments (70,72) provides a first resistive value and the resistance of the MTJ 55 with the substantially parallel orientation between the magnetic moments (70,72) provides a second resistive value. Therefore, the binary value can be determined by measuring the resistance or an electrical property associated with the resistance of the MTJ 55 (i.e., reading the MTJ), which can be several thousand ohms ($\Omega$). However, the MTJ 55 can be configured to provide resistances that are less than several thousand ohms and resistances that are greater than several thousand ohms.

In a specific example, the tunnel barrier region 60 is formed of aluminum oxide ($Al_2O_3$) having a thickness 74 of less than approximately forty angstroms (40 Å). In addition, one magnetic region 56 is formed of cobalt (Co) having a thickness 62 of approximately one thousand angstroms (1000 Å) and the other magnetic region 58 is formed of nickel iron (NiFe) having a thickness 64 of approximately one thousand angstroms (1000 Å). This configuration of the MTJ 55 provides a change of resistance versus the resistance ($\Delta R/R$) that is approximately fifteen percent (15%). However, other materials, combination of materials, and thicknesses can be used in accordance with the present invention. Moreover, other MTJs can be used in accordance with the present invention.

For example, a second exemplary embodiment of an MTJ 76 is illustrated in FIG. 4 that is interposed between a write bit line 78 and a write word line 80. The MTJ 76 is described in U.S. Pat. No. 6,545,906, entitled "A Method of Writing to a Scalable Magnetoresistance Random Access Memory Element," issued Apr. 8, 2003, naming Leonid Savtchenko as an inventor and referred to hereinafter as the Savtchenko Reference. The Savtchenko Reference is hereby incorporated in its entirety by reference.

Generally, the MTJ 76 has two magnetic regions (82,84) and a tunneling barrier region 86 interposed between the two magnetic regions (82,84). The two magnetic regions (82,84) are multi-layer structures and the tunnel barrier region 86 is a single layer structure in this example. The multi-layer structure of one magnetic region 82 is a tri-layer structure that has a non-magnetic layer 88 interposed between two ferromagnetic layers (90,92), and the other magnetic region 84 is a dual-layer that has an anti-ferromagnetic layer 94 and a ferromagnetic layer 96. However, the magnetic regions (82,84) and the tunnel barrier region 86 can have additional layers to form other multi-layer structures than the tri-layer structure, dual-layer structure, and single layer structure. For example, the magnetic regions (82,84) and/or the tunnel barrier region 86 can have one or more additional anti-ferromagnetic layers, ferromagnetic layers, substrate layers, seed layers, and/or template layers.

The non-magnetic layer 88 can be formed of any number of suitable non-magnetic materials or anti-ferromagnetic materials such as ruthenium (Ru), osmium (Os), rhenium (Re), chromium (Cr), rhodium (Rh), or copper (Cu), or combinations thereof, and the anti-ferromagnetic layer 94 can be formed with any number of suitable anti-ferromagnetic materials such as manganese alloys (e.g., iridium manganese iridium manganese (IrMn), iron manganese (FeMn), rhodium manganese (RhMn), platinum manganese (PtMn), and platinum palladium manganese (PtPdMn)). The ferromagnetic layers (90,92,96) can be formed of any number of suitable ferromagnetic materials such as nickel (Ni), iron (Fe), or cobalt (Co), or combinations thereof (e.g., nickel iron (NiFe), cobalt iron (CoFe) and nickel iron cobalt (NiFeCo)) and the tunnel barrier region 86 can be formed of one or more non-conductive materials. For example, the tunnel barrier region 86 can be formed of aluminum oxide ($Al_2O_3$), hafnium oxide ($HfO_2$), Boron oxide ($B_2O_3$), tantalum oxide ($Ta_2O_5$), zinc oxide ($ZnO_2$) and other oxides, nitrides, or other suitable dielectrics. However, other materials or combination of materials can be used in these layers in accordance with the present invention.

The formation of the non-magnetic layer 88 interposed between the two ferromagnetic layers (90,92) provides the free magnetic region 82 with a resultant magnetic moment 98 that is free to rotate in the presence of applied magnetic fields. In addition, the formation of the anti-ferromagnetic layer 94 and the ferromagnetic layer 96 provides the pinned magnetic region 84 with a resultant magnetic moment 100 that that does not typically rotate in the presence of the applied magnetic fields that rotate the resultant magnetic moment 98 of the free magnetic region. The resultant magnetic moment 100 of the pinned magnetic region 84 is substantially pinned in a predefined direction, which can be any number of directions in accordance with the present invention, and the resultant magnetic moment 98 of the free magnetic region 82 is the result of the magnetic moments (102,104) of the ferromagnetic layers (90,92), which are both preferably free to rotate.

The magnetic moments (102,104) of the free magnetic region 82 are preferably non-parallel with respect to each other and more preferably at least substantially anti-parallel. In addition, the magnetic moments (102,104) are preferably balanced, which as used herein shall mean that the fractional balance ratio ($M_{br}$) as set forth in equation (1) is in the range of about zero (0) to about one tenth (1/10) (i.e., $0 \leq M_{br} \leq 0.1$).

$$M_{br} = \Delta M/M_{total} = (|M_2| - |M_1|)/(|M_1| + |M_2|) \tag{1}$$

Where $|M_1|$ is the magnitude of one magnetic moment 102 and $|M2|$ is the magnitude of the other magnetic moment 104. However, other configurations of the MTJ 76 are available with unbalanced magnetic moments. The magnitudes of the magnetic moments (102,104) of the free magnetic region 82 can be selected using any number of techniques known to those of ordinary skill in the art. For example, the thicknesses (106,108) of the ferromagnetic layers (90,92) can be adjusted to provide moments with magnitudes that provide the balance or an imbalance.

The magnetic moments (102,104) are preferably coupled with the non-magnetic layer 88. While the non-magnetic layer 88 anti-ferromagnetically couples the magnetic moments (102,104), it will be understood that the anti-ferromagnetic coupling can be provided with other mechanisms. For example, the mechanism for anti-ferromagnetically coupling can be a magnetostatic field.

The relative orientation of the resultant magnetic moment 100 of the pinned magnetic region 84 and the resultant magnetic moment 98 of the free magnetic region 82, which are effectively the magnetic moments of the ferromagnetic layers (92,96) adjacent to the tunnel barrier region 86, affects the tunneling resistance of the MTJ 76. Therefore, as the resultant magnetic moment 98 of the free magnetic region 82 rotates and the resultant magnetic moment 98 of the pinned magnetic region 84 remains substantially constant, the resistance of the MTJ 76 changes and the varying resistance values can be assigned any number of values.

The values of the MTJ 76 are binary values (e.g., 0 or 1) in accordance with an exemplary embodiment of the present invention. One of the binary values corresponds to a substantially parallel orientation between the resultant moment 98 of the free magnetic region 82 and the resultant magnetic moment 100 of the pinned magnetic region 84 (i.e., a first magnetization state). The other binary value corresponds to a substantially anti-parallel orientation between the resultant moment 98 of the free magnetic region 82 and the resultant magnetic moment 100 of the pinned magnetic region 84 (i.e., a second magnetization state). The resistance of the MTJ 76 with the substantially anti-parallel orientation provides a first resistive value and the resistance of the MTJ 76 with the substantially parallel orientation provides a second resistive value. Therefore, the binary value can be determined by measuring the resistance of the MTJ 76 (i.e., reading the MTJ) at a first time ($t_1$), repositioning the resultant magnetic moment 98 of the free magnetic region 82 to change the binary value stored by the MTJ 76 (i.e., writing the MTJ) at a second time ($t_2$), measuring the resistance of the MTJ 76 (i.e., reading the MTJ) at a second time ($t_2$), and comparing the resistance of the MTJ 76 measured at the first time ($t_1$) with the resistance of the MTJ 76 measured at the second time ($t_2$) at a third time ($t_3$).

Figure 5:
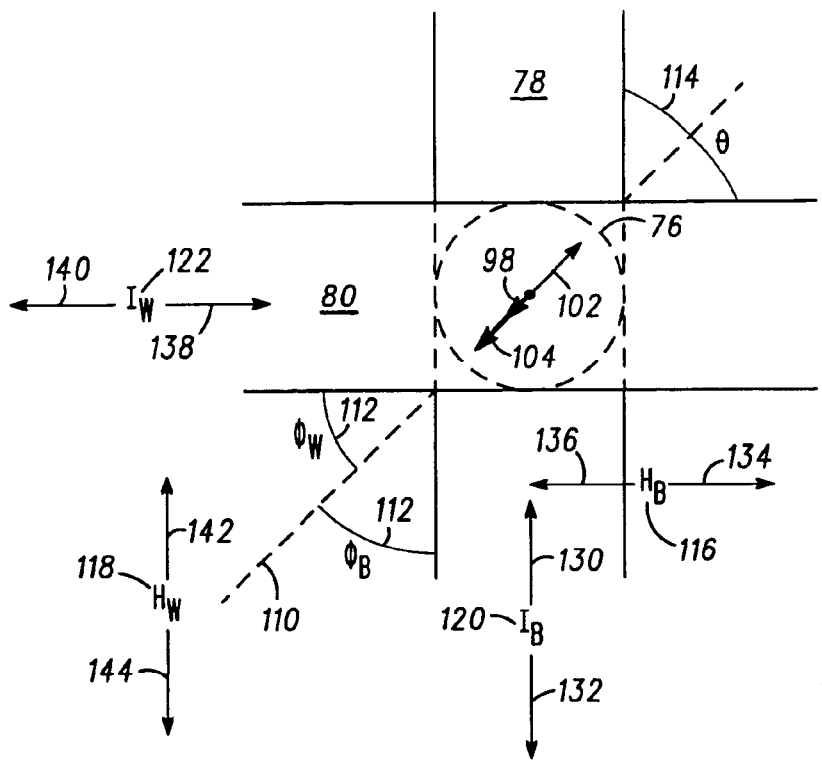
FIG. 5 is a simplified plan view of the MTJ of FIG. 4.

Referring to FIG. 5, the resultant magnetic moment 98 of the free magnetic region 82 is preferably oriented along an anisotropy easy-axis 110 in a direction that is at an angle ($\Phi_W$ or $\Phi_B$) 112 with respect to at least one of the write bit line 78 or write word line 80. More preferably, the resultant magnetic moment 98 is oriented along an anisotropy easy-axis 110 in a direction that is at about a forty-five degree (45°) angle with respect to the write word line 80 (i.e., $\Phi_W \approx 45°$) or the write bit line 78 (i.e., $\Phi_B \approx 45°$) and preferably at such an angle with the write bit line 78 and the write word line 80 (i.e., $\Phi_W \approx 45°$ and ($101_B \approx 45°$). However, other orientations of the resultant magnetic moment 98 with respect to the write bit line 78 and/or the write word line 80 can be used in accordance with the present invention.

In addition to the preferred orientation of the resultant magnetic moment 98 with respect to the write bit line 78 and/or the write word line 80, the write bit line 78 is preferable oriented at an angle (θ) 114 with respect to the write word line 80. Preferably, the angle (θ) 114 is greater than about 60 degrees (60°) and less than about one-hundred and twenty degrees (120°). Most preferably, the angle (θ) 114 is about 90 degrees (90°).

The orientation of the write bit line 78 and the write word line 80 and the proximity of these lines (78,80) to the MTJ 76 provides a configuration in which two magnetic fields (116,118) emitted by the two lines (78,80) can alter the magnetic moments (102,104) of the ferromagnetic layers (90,92) and therefore alter the orientation of the resultant magnetic moment 98 to change the binary value stored by the MTJ 76 (i.e., writing the MTJ). One magnetic field 116 is preferably produced with the introduction of an electrical current 120 in the write bit line 78 and the other magnetic field 118 is preferably produced with the introduction of an electrical current 122 in the write word line 80. Therefore, the magnetic field 116 produced by the electrical current ($I_B$) 120 in the write bit line 78 shall be referred to as the bit magnetic field ($H_B$) 116 and the magnetic field 118 produced by the electrical current 122 in the write word line 80 shall be referred to as the word magnetic field ($H_W$) 118 for convenience.

Figure 6:
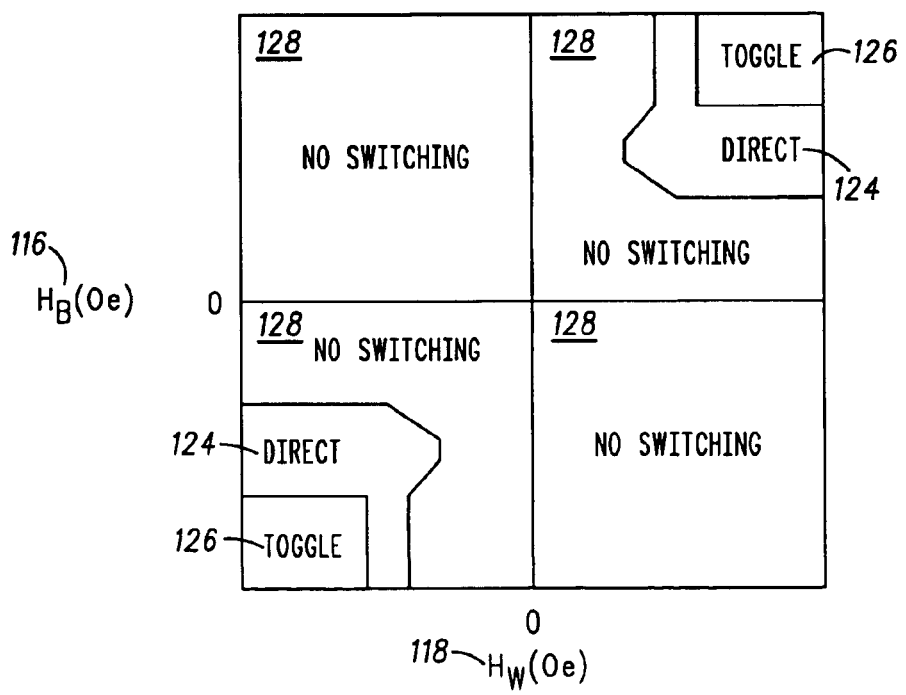
FIG. 6 is a graph illustrating magnetic field combinations that produce a direct write, a toggle write and no switching in the MTJ of FIG. 4.

Referring to FIG. 6, a graph is presented that illustrates the writing regions (124,126) and no switching regions 128 for the MTJ 76 shown in FIG. 4 and FIG. 5 in relation to the application of the bit magnetic field ($H_B$) 116 and the word magnetic field ($H_W$) 118 as shown in FIG. 5. The two types of writing regions are the direct write regions 124 and toggle write regions 126. The combination of magnetic fields (116,118) associated with the no switching regions 128 do not affect a write as the combination of magnetic fields associate with the no switching regions do not alter the respective orientation of the resultant magnetic moment of the free magnetic region as subsequently described and illustrated in this detailed description. However, the combination of magnetic fields (116,118) in the direct write regions 124 and toggle write regions 126 have the potential of altering the respective orientation of the resultant magnetic moments by altering the position of the resultant magnetic moment of the free magnetic region.

The combination of magnetic fields (116,118) associated with the toggle write regions 126, which will be referred herein as a toggle write or toggling of an MTJ, results in a reorientation of the resultant magnetic moments irrespective of the existing orientation of the resultant magnetic moments of the MTJ. For example, if the resultant magnetic moments of the free magnetic region and the pinned magnetic region are at least substantially parallel and a toggle write is conducted, the resultant magnetic moments are changed to the at least substantially anti-parallel orientation after the toggle write. Conversely, if the resultant magnetic moments are at least substantially anti-parallel and a toggle write is conducted, the resultant magnetic moments are altered to the at least substantially parallel orientation after the toggle write. Therefore, the toggle write changes the binary value to the other binary value regardless of the binary value stored at the time the toggle write commences.

In contrast to the toggle write, the combination of magnetic fields (116,118) associated with the direct write regions 124, which will be referred to herein as a direct write, results in a reorientation of the resultant magnetic moments only if the desired orientation of the resultant magnetic moments that is sought by the direct write is different than the existing orientation of the resultant magnetic moments prior to the direct write. For example, if the resultant magnetic moments are at least substantially parallel and a direct write is conducted to request an at least substantially parallel orientation between the resultant magnetic moments, the resultant magnetic moments remain in the at least substantially parallel orientation. However, if the resultant magnetic moments are at least substantially parallel and a direct write is conducted to request an at least substantially anti-parallel orientation between the resultant magnetic moments, the resultant magnetic moments are oriented into the at least substantially anti-parallel orientation. Conversely, if the resultant magnetic moments are at least substantially anti-parallel and a direct write is conducted to request an at least substantially anti-parallel orientation between the resultant magnetic moments, the resultant magnetic moments remain in the at least substantially anti-parallel orientation, and if the resultant magnetic moments are at least substantially anti-parallel and a direct write is conducted to request an at least substantially parallel orientation between the resultant magnetic moments, the resultant magnetic moments are oriented into the at least substantially parallel orientation.

The requested orientation in a direct write is generally determined by the polarity of the magnetic fields (116,118). For example, if a parallel orientation between the resultant magnetic moments is sought, the two magnetic fields (116, 118) are positive and if an anti-parallel orientation between the resultant magnetic moments is sought, both magnetic fields (116,118) are negative. However, the MTJ 76 as shown in FIG. 4 and FIG. 5 can be configured for direct write configurations with other polarities.

Referring to FIG. 5, the polarities of the magnetic fields (116,118) and the magnitudes of the magnetic fields (116, 118) for the direct write and toggle write are produced in this exemplary embodiment with the introduction and adjustment of electrical currents (120,122) in the bit line 78 and the word line 80 having the corresponding polarities and magnitudes. As can be appreciated by those of ordinary skill in the art, introduction of an electrical current in a line produces a corresponding magnetic field about the line. Therefore, introduction of an electrical current 120 in the bit line 78 and introduction of an electrical current 122 in the word line 80 will produce the bit magnetic field 116 and the word magnetic field 118, respectively. Furthermore, a positive current 130 and a negative current 132 in the bit line 104, which are arbitrarily defined for illustrative purposes, produces a positive bit magnetic field 134 and a negative bit magnetic field 136, respectively. In addition, a positive current 138 in the word line 80 and a negative current 140 in the word line 80, which are arbitrarily defined for illustrative purposes, produces a positive word magnetic field 142 and a negative word magnetic field 144, respectively. Furthermore, an increase in the magnitude of the electrical current 122 in the word line 80 and an increase in the magnitude of the electrical current 120 in the bit line 78 results in an increase in the magnitude of the word magnetic field 118 and bit magnetic field 116, respectively. Moreover, a decrease in the magnitude of the electrical current 122 in the word line 80 and a decrease in the magnitude of the electrical current 120 in the bit line 78 results in a decrease in the magnitude of the word magnetic field 118 and the bit magnetic field 116, respectively.

Figure 7:
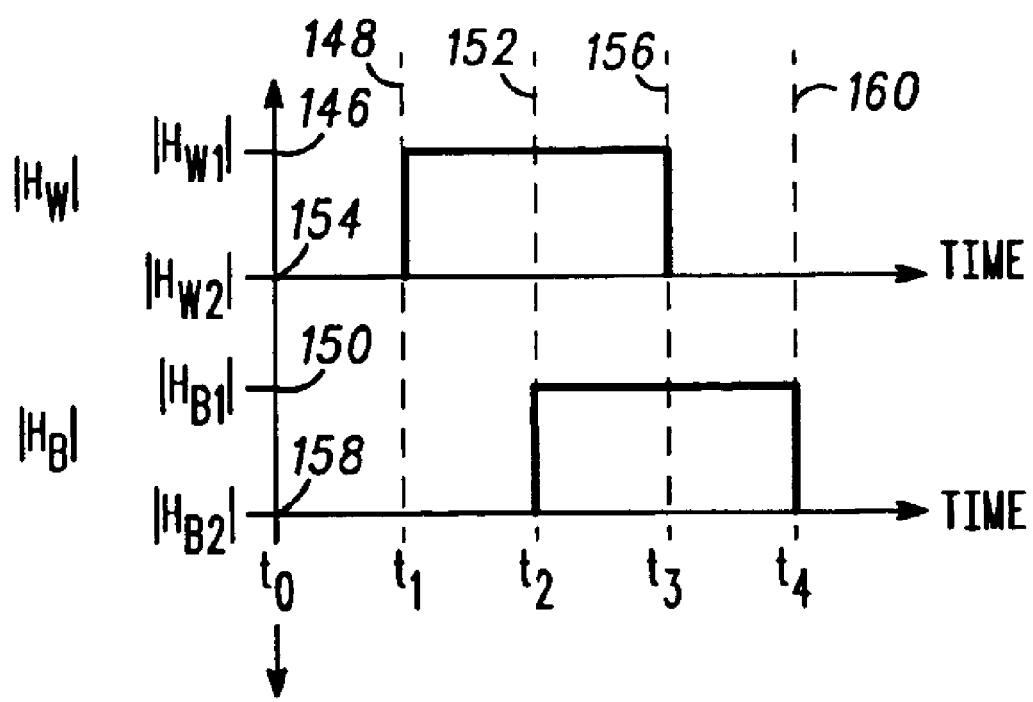
FIG. 7 is a timing diagram of magnetic fields for a direct write or toggle write in the MTJ of FIG. 4.

Referring to FIG. 7, a sequence is illustrated for generating magnetic fields with the application of currents in the word line and the bit line to perform a direct write or a toggle write in the MTJ 76 illustrated in FIG. 4 and FIG. 5. A word magnetic field having a first word magnitude ($|H_{W1}|$) 146 is produced at a first time ($t_1$) 148 with the introduction of an electrical current in the word line and a bit magnetic field having a first bit magnitude ($|H_{B1}|$) 150 is produced at a second time ($t_2$) 152 with an introduction of an electrical current in the bit line. After the bit magnetic field having the first word magnitude ($|H_{B1}|$) 150 is produced at the second time ($t_2$) 152, the current in the word line current is adjusted to reduce the word magnetic field to a second bit magnitude ($|H_{W2}|$) 154, which is preferably about zero (0), at a third time ($t_3$) 156. Once the word magnetic field is reduced to the second word magnitude ($|H_{W2}|$) 154, the current in the bit line is adjusted to reduce the bit magnetic field to a second bit magnitude ($|H_{B2}|$) 158 at a fourth time ($t_4$) 160. This reduction in the word magnetic field to the second word magnitude ($|H_{W2}|$) 154 completes the exemplary sequence.

At the completion of this sequence or any number of other sequences, the magnetic moments of the two ferromagnetic layers of the free magnetic layer and therefore the resultant magnetic moment of the free magnetic layer are rotated to the position other than the existing position prior to the sequence or remain in the relative orientation that existed prior to the sequence depending on magnitude of the fields, as the magnitudes of the magnetic fields select the direct write or toggle write as shown in FIG. 6.

FIGS. 8–12 illustrate an example of a toggle write from the first binary value to the second binary value, FIGS. 13–17 illustrate an example of a toggle write from the second binary value to the first binary value, FIGS. 18–22 illustrate an example of a direct write from the first binary value to the second binary value, and FIGS. 23–27 illustrate an example of a direct write when the first binary value is written and the MTJ of FIG. 4 is already in the orientation that provides the first binary value. These writing methods are selective as both magnetic fields from the bit line and the current line are needed to write the MTJ 76 of FIG. 4 (See the rotation of the magnetic moments (102,104) and resultant magnetic moment 98 illustrated in FIGS. 28–32 for the unitary magnetic field sequence shown in FIG. 33 for an illustration of the selective nature of the MTJ of FIG. 4).

The MTJ 76 of FIG. 4 and FIG. 5, the MTJ of FIG. 2 and FIG. 3, and/or any other MTJ can be coupled or connected as illustrated and describe with respect to the MRAMs of the present invention. For example and with reference to FIG. 1, the memory cells of the ganged memory cells (38,48,50,52) are coupled in series, and more preferably connected in series in accordance with a first exemplary embodiment of the MRAM 20 of the present invention. For example and in accordance with the previous description in this detailed description, a second MTJ terminal 170 of the first memory cell 30 is connected to the second MTJ terminal 172 of the second memory cell 32, the first MTJ terminal 174 of the second memory cell 32 is connected to the first MTJ terminal 176 of the third memory cell 34, and the second MTJ terminal 178 of the third memory cell 34 is connected to the second terminal 180 of the fourth memory cell.

As can be appreciated by those of ordinary skill in the art, the resistance (R) for the MTJs 54 of the first ganged memory cell 38, and other ganged memory cells (38,48,50, 52) having MTJs coupled in series is as follows:

$$R = R_{MTJ1} + R_{MTJ2} + \ldots + R_{MTJK} \quad (3)$$

Where $R_{MTJK}$ is the resistance associated with the $K^{th}$ MTJ in the ganged memory cell, and K is the number of MTJs that are connected in series in the ganged memory cell. As will be subsequently described in greater detail, the resistance of a ganged memory cell can be determined before altering the magnetization state (i.e., altering the orientation between the resultant magnetic moment of the free magnetic region and the resultant magnetic moment of the pinned region, which generally affects the resistance) of an MTJ in the ganged memory cell and the resistance can be determined after altering the magnetization state of the MTJ cell in the ganged memory cell. The change in the resistance, which will be substantially due to the change in the resistance of the MTJ with the change in the magnetization state, can be evaluated and the state of the MTJ can be determined in accordance with the present invention as subsequently described in greater detail.

Figure 34:
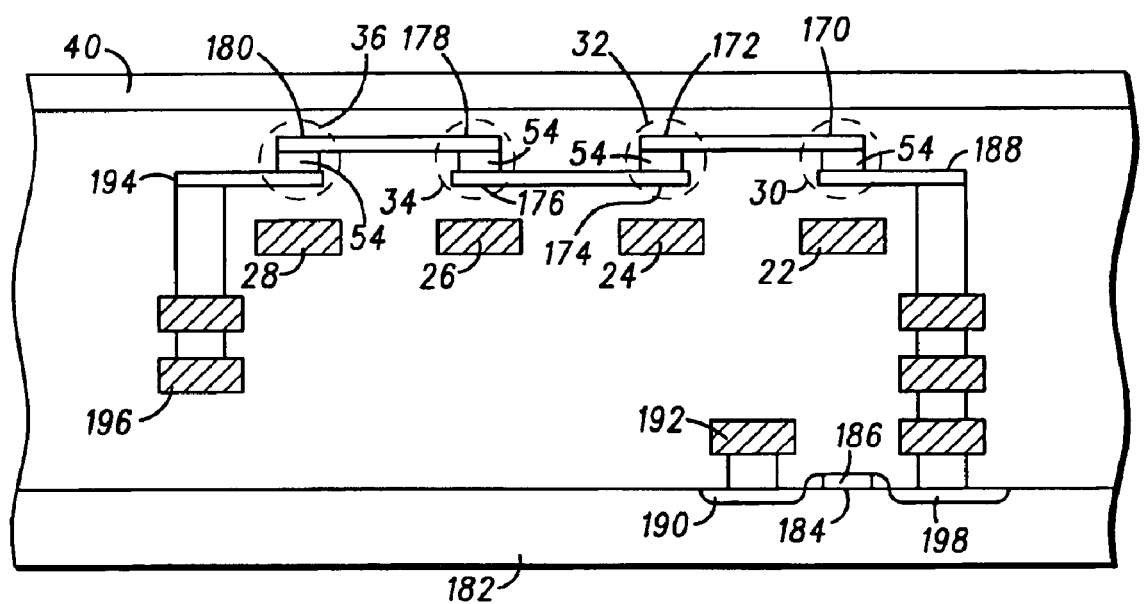
FIG. 34 is a sectional view of the MRAM of FIG. 1 as formed on a substrate in accordance with an exemplary embodiment of the present invention.

Referring to FIG. 34, a cross-sectional view is illustrated for the MRAM 20 of FIG. 1. The cross-sectional view illustrates that vias and interconnect lines, which are illustrated as T-shaped structures that couples the memory cells (30,32,34,36) of the first ganged memory cell 38 on a substrate 182, which is preferably a semiconductor substrate. A group isolation transistor 184 is formed as Metal-Oxide Semiconductor Field Effect Transistors (MOSFETS) in substrate 182 using standard semiconductor techniques. However, other transistors can be used in accordance with the present invention. A read word line 186 is formed and configured to operate as the gate terminal for the group read isolation transistor 184. The source 198 of the group read isolation transistor 184 is connected to the first MTJ terminal 188 of the first memory cell 30 and the drain 190 of the first group read isolation transistor 184 is preferably connected to the read bit line 192. In addition, the write bit line 40 and write word lines (22,24,26,28) are formed with metallization steps using standard semiconductor techniques so as to position the MTJs 54 of the memory cells adjacent to the write bit line 40 and write word lines (22,24,26,28) as previously described in this detailed description of the invention. The write word lines (22,24,26,28) and the write bit line 40 preferably positioned in close proximity to the MTJs 54 in order to reduce the write word current and magnetic interaction with adjacent rows or columns.

Figure 35:
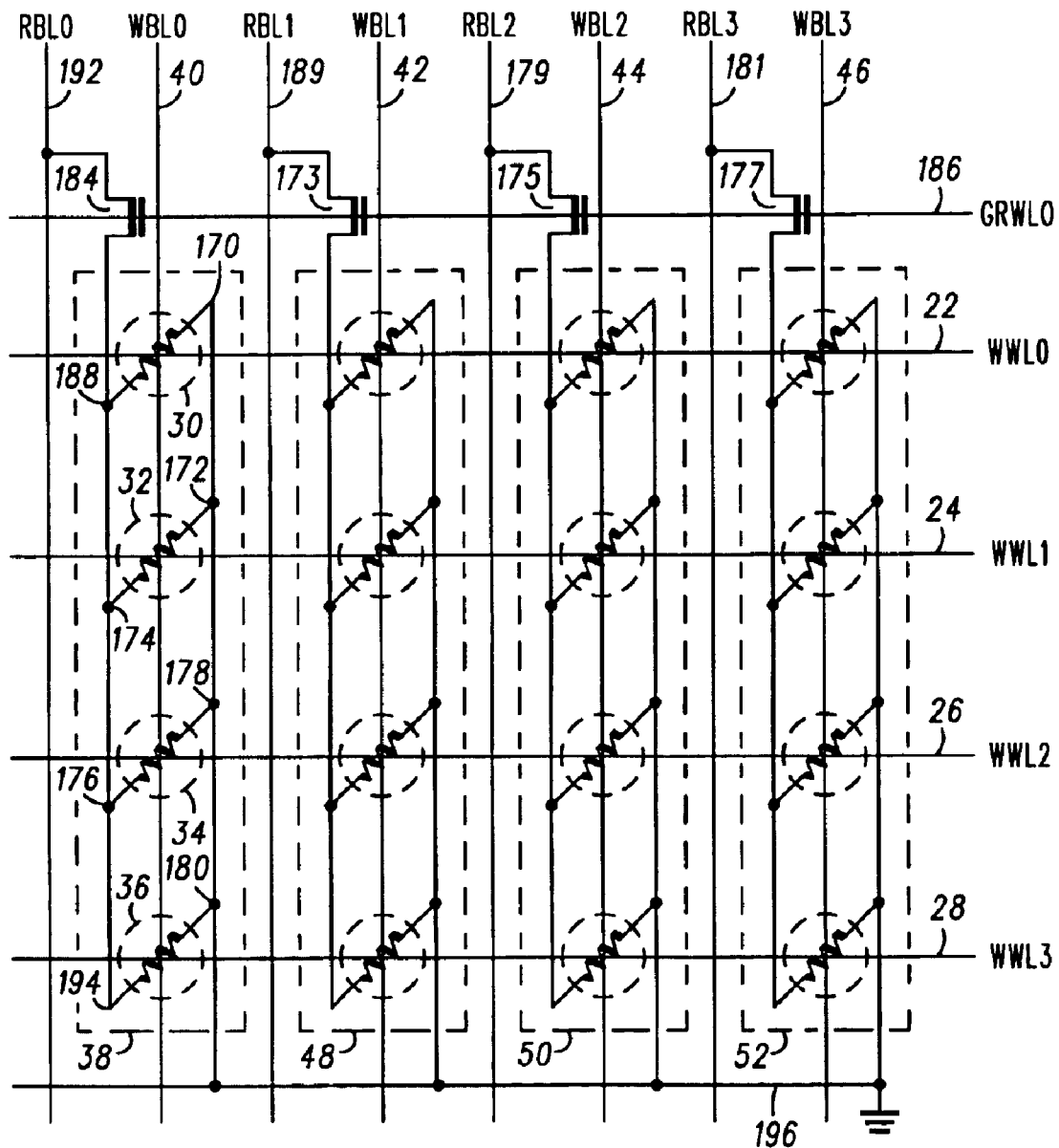
FIG. 35 is a schematic diagram of an MRAM in accordance with a second exemplary embodiment of the present invention.
Figure 36:
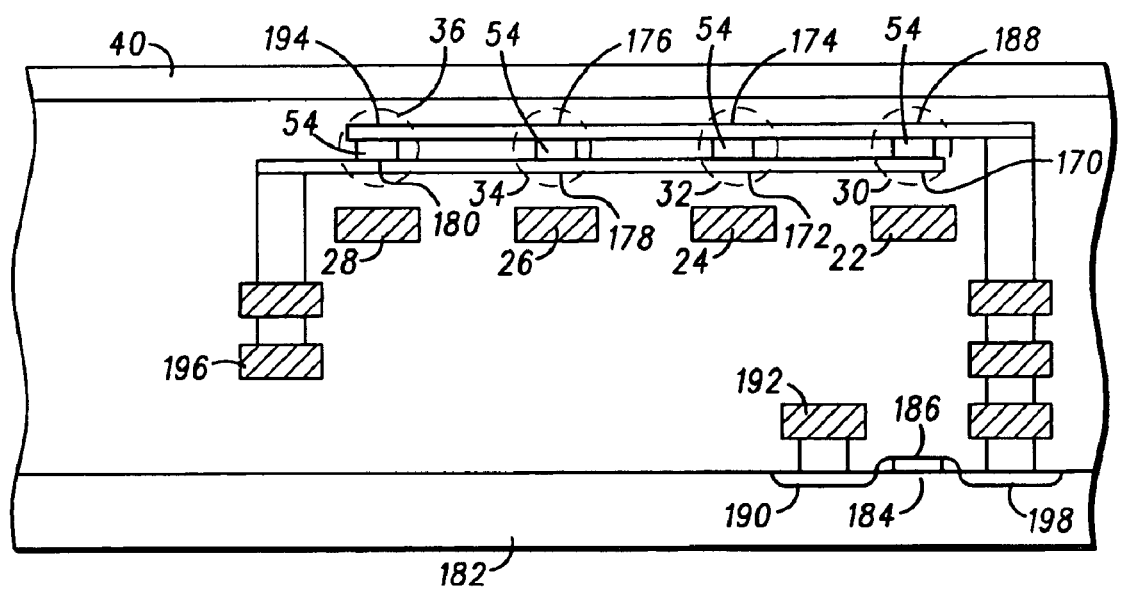
FIG. 36 is a sectional view of the MRAM of FIG. 35 as formed on a substrate in accordance with an exemplary embodiment of the present invention.

Referring to FIG. 35 and FIG. 36, a second exemplary embodiment of the MRAM 20 is illustrated with the memory cells of the ganged memory cells (38,48,50,52) coupled in parallel, and more preferably connected in parallel. For example, the second MTJ terminals 170 of the first memory cell 30 is connected to the second MTJ 172 terminal of the second memory cell 32, the second MTJ terminal 172 of the second memory cell 32 is connected to the second MTJ terminal 178 of the third memory cell 34, and the second MTJ terminal 178 of the third memory cell 34 is connected to the second MTJ terminal 180 of the fourth memory cell 36. In addition, a first MTJ terminal 188 of the first memory cell 30 is connected to the first MTJ terminal 174 of the second memory cell 32, the first MTJ terminal 174 of the second memory cell 32 is connected to the first MTJ terminal 176 of the third memory cell 34, and the first MTJ terminal 176 of the third memory cell 34 is connected to the first MTJ terminal 194 of the fourth memory cell 36. As can be appreciated by those of ordinary skill in the art, the resistance (R) for the MTJs 54 of the first ganged memory cell 38, and other ganged memory cells (38,48,50, 52) having MTJs coupled in parallel is as follows:

$$1/R = 1/R_{MTJ1} + 1/R_{MTJ2} + \ldots + 1/R_{MTJK} \quad (3)$$

Where $R_{MTJK}$ is the resistance associated with the $K^{th}$ MTJ in the ganged memory cell, and K is the number of MTJs that are connected in parallel in the ganged memory cell. This resistance of the ganged memory cell can be used to read the state of an MTJ in the ganged memory cell, and other MTJs couplings can be used in accordance with the present invention, including parallel and series combinations of MTJs.

Figure 37:
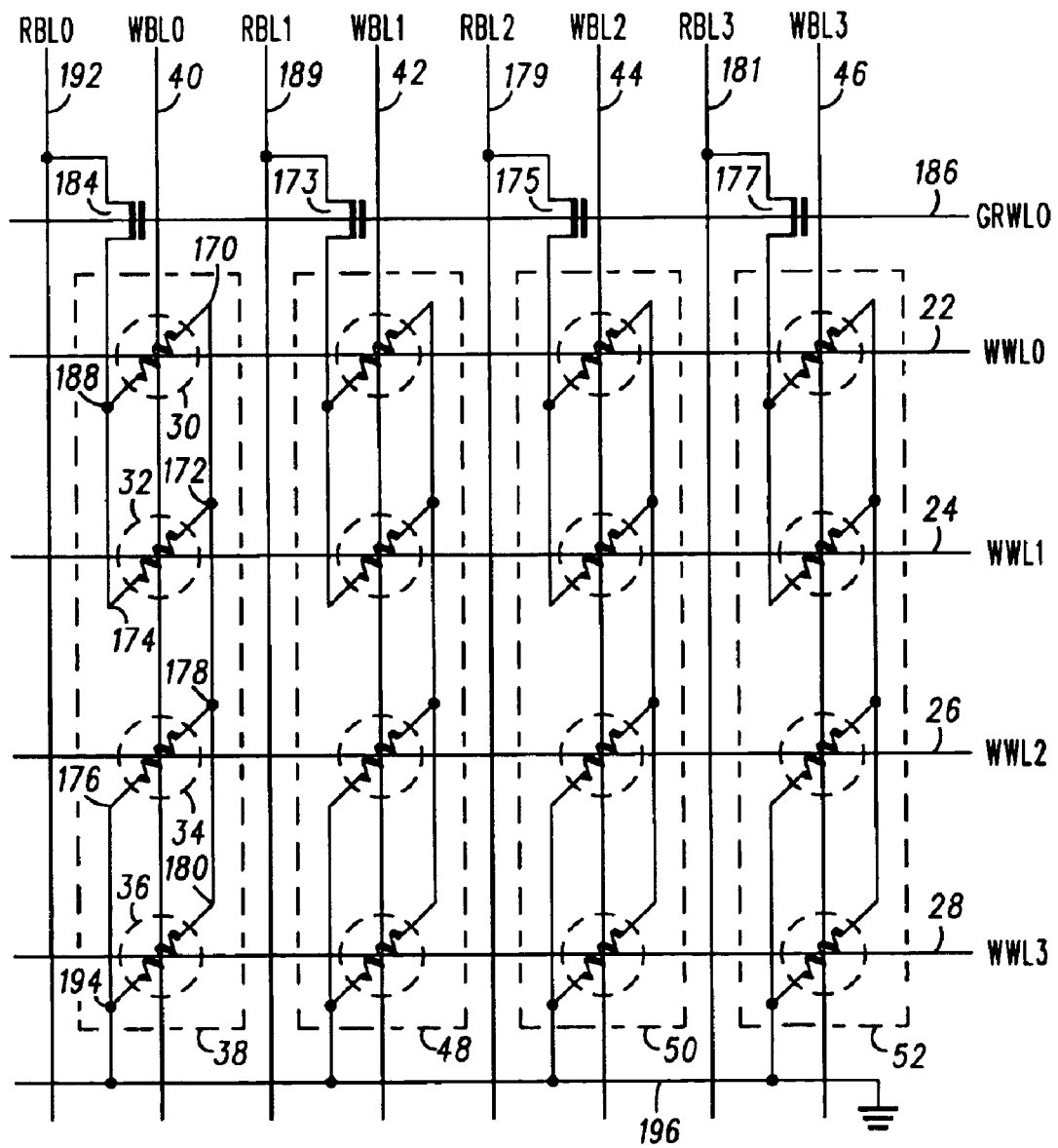
FIG. 37 is a schematic diagram of an MRAM in accordance with a third exemplary embodiment of the present invention.
Figure 38:
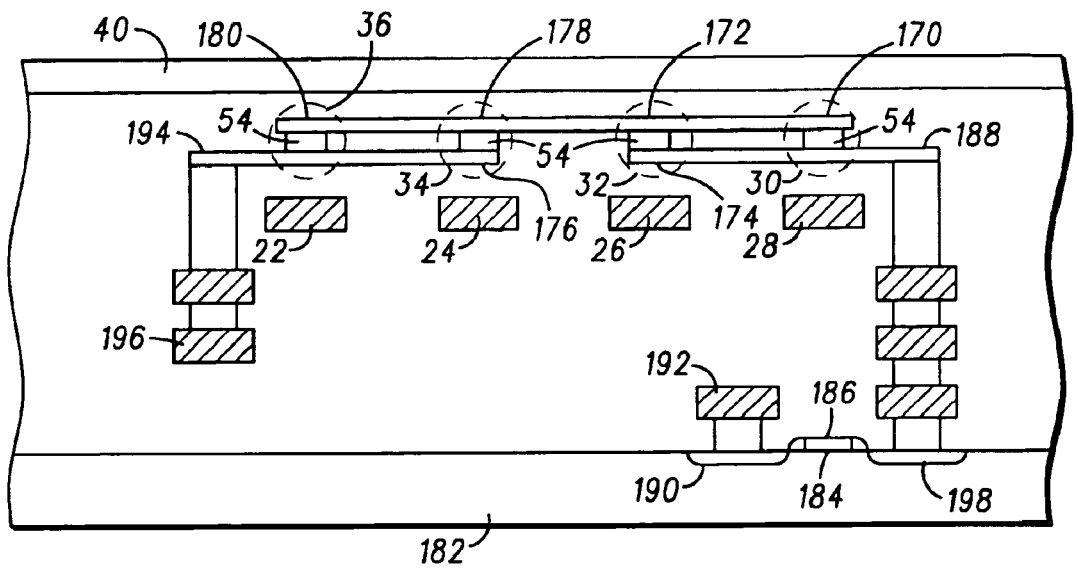
FIG. 38 is a sectional view of the MRAM of FIG. 37 as formed on a substrate in accordance with an exemplary embodiment of the present invention.

Referring to FIG. 37 and FIG. 38, a third exemplary embodiment of the present invention is illustrated with the memory cells of the ganged memory cells (38,48,50,52) coupled in parallel and in series, and more preferably connected in parallel and in series. For example, the first memory cell 30 is connected in parallel with the second memory cell 32 to form a first memory cell group, the third memory cell 34 is connected in parallel with the fourth memory cell 36 to form a second memory cell group, and the first memory cell group is connected in series with the second memory cell group. More specifically, and by way of example only, the second MTJ terminal 170 of the first memory cell 30 is connected to the second MTJ terminal 172 of the second memory cell 32, the first MTJ terminal 188 of the first memory cell 30 is connected to the first MTJ terminal 174 of the second memory cell 32, the second MTJ terminal 178 of the third memory cell 34 is connected to the second MTJ terminal 180 of the fourth memory cell 36, the first MTJ terminal 176 of the third memory cell 34 is connected to the first MTJ terminal 194 of the fourth memory cell 36, and one of the second MTJ terminals 172 of the second memory cell 32 is connected to the second MTJ terminal 178 of the third memory cell 34. As can be appreciated by those of ordinary skill in the art, the resistance (R) for the MTJs 54 of the first ganged memory cell 38, and other ganged memory cells (38,48,50,52) having two MTJs coupled in parallel and series combination of the parallel MTJs is as follows:

$$R = \quad (4)$$
$$(R_{MTJ1} * R_{MTJ2} / R_{MTJ1} + R_{MTJ2}) + (R_{MTJ3} * R_{MTJ4} / R_{MTJ3} + R_{MTJ4}) +$$
$$\ldots + (R_{MTJ(K-1)} * R_{MTJK} / R_{MTJ(K-1)} + R_{MTJK})$$

Where $R_{MTJK}$ is the resistance associated with the $K^{th}$ MTJ and $R_{MTJ(K-1)}$ is the resistance associated with the $K^{th}-1$ MTJ in the ganged memory cell, and K is the number, preferably an even number, of MTJs that are connected in the ganged memory cell. As with the other exemplary embodiments, this resistance of the ganged memory cell can be used to read the state of a memory cell in the ganged memory cell. Other MTJs couplings with any number of MTJs in a ganged memory cell can be used in accordance with the present invention, including combined parallel and series combinations of MTJs.

As previously described in this detailed description of the invention, a first resistance is presented by an MTJ when the resultant magnetic moments are positioned in a first orientation or first magnetization state (e.g., substantially anti-parallel) and a second resistance is presented by the MTJ that is less than the first resistance when the resultant magnetic moments are positioned in a second orientation or second magnetization state (e.g., substantially parallel) using any number of techniques, including the toggle write or the direct write previously described in this detailed description. Accordingly, a first resistance is presented by the ganged memory cell when the resultant magnetic moments of one of the MTJs of the ganged memory cell is positioned in a first orientation or first magnetization state (e.g., substantially anti-parallel) and a second resistance is presented by the ganged memory cells that is less than the first resistance when the resultant magnetic moments of the one of the MTJs of the ganged memory cell is altered to a second orientation or second magnetization state (e.g., substantially parallel). Therefore, an MTJ in a ganged memory cell can be read by measuring an electrical value of the ganged memory cell associated with the resistance before changing the orientation of the resultant magnetic moments of the MTJ and after changing the orientation of the resultant magnetic moments of the MTJ as the resistance of the ganged memory cell will increase if the resistance of the MTJ increases and decrease if the resistance of the MTJ decreases.

Figure 39:
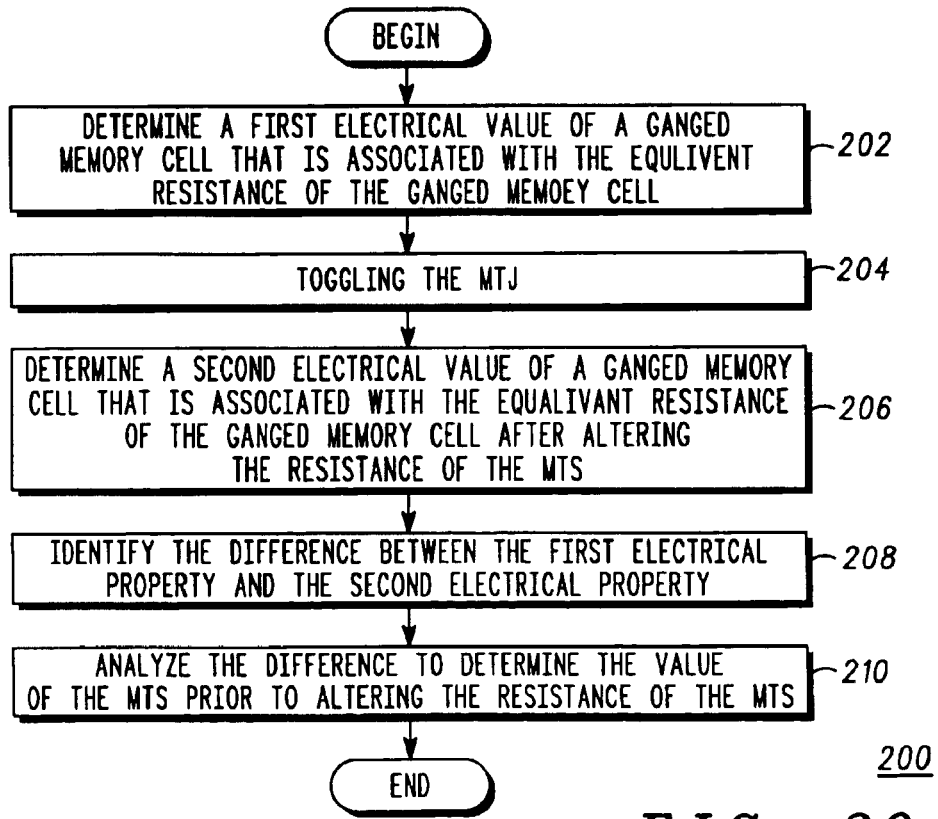
FIG. 39 is a flowchart of the method for reading an MTJ in an MRAM in accordance with an exemplary embodiment of the present invention.

Referring to FIG. 39, a method 200 is illustrated for reading an MTJ in a MRAM in accordance with an exemplary embodiment of the present invention. Initially, a first electrical value is determined that is determined that is associated with the equivalent resistance of the ganged memory cell 202. For example, a voltage can be applied across the ganged memory cell and the current can measured that is associated with the applied voltage. However, other electrical properties of the ganged memory cell can be determined that are associated with the resistance of the ganged memory cell, such as the net time-rate of transference of charge (i.e., current ($I_{eq}$)) through the ganged memory cell current and/or the actual equivalent resistance (i.e., $R_{eq}=V_{eq}/I_{eq}$) presented by the ganged memory cell.

After determining the first electrical value of the ganged memory cell 202, the method 200 continues with a toggle write or toggling of the MTJ 204. As previously described in this detailed description, this toggling results in a reorientation of the resultant magnetic moments irrespective of the existing orientation of the resultant magnetic moments of the MTJ (e.g., if the resultant magnetic moments of the free magnetic region and the pinned magnetic region are at least substantially parallel and a toggling of the MTJ is conducted, the resultant magnetic moments are changed to the at least substantially anti-parallel orientation after the toggling and conversely, if the resultant magnetic moments are at least substantially anti-parallel and a toggle write is conducted, the resultant magnetic moments are altered to the at least substantially parallel orientation after the toggling). Therefore, the toggling changes the binary value to the other binary value regardless of the binary value stored at the time the toggling commences.

After toggling the MTJ, a second electrical value of the ganged memory cell is determined that is associated with the resistance of the ganged memory cell 206. The second electrical value of the ganged memory cell can be determined in the manner used to determine the first electrical value or another technique can used to determine the second electrical value. A difference between the first electrical value and the second electrical value is identified 208 and analyzed 210 to complete the read of the MTJ using any number of techniques, such as the techniques previously described and subsequently described in this detailed description.

For example, and with reference to FIG. 1, the second memory cell 32 in the first ganged memory cell 38 can be read by applying a known current to the first ganged memory cell 38 and measuring a first voltage across the first ganged memory cell 38, changing the resistance of the second memory cell 32, applying the known current to the first ganged memory cell 38 and measuring a second voltage across the first ganged memory cell 38 after changing the resistance of the second memory cell 32, and comparing and analyzing the difference between the first voltage and the second voltage to complete the read of the second memory cell 32. For example, if the second voltage is less than the first voltage, the resistance of the first ganged memory cell 38 decreased with the change in the resistance of the second memory cell 32. Therefore, the resistance of the second memory cell 32 decreased with the change in the resistance of the second memory cell 32 and the original value of the second memory cell 32 is the value associated with the original greater resistive value of the ganged memory cell 38 (i.e., the second memory cell originally exhibited the greater resistive value). If the second voltage is greater than the first voltage, the equivalent resistance of the first ganged memory cell 38 increased with a change in the resistance of the second memory cell and the original value of the second memory cell 38 is the value associated with the lower resistive value of the ganged memory cell 38. However, other schemes can be used to identify the value based upon the change in the equivalent resistance, and numerous apparatuses and methods can be used to accomplish these alternate schemes and the foregoing scheme presented as an example.

Figure 40:
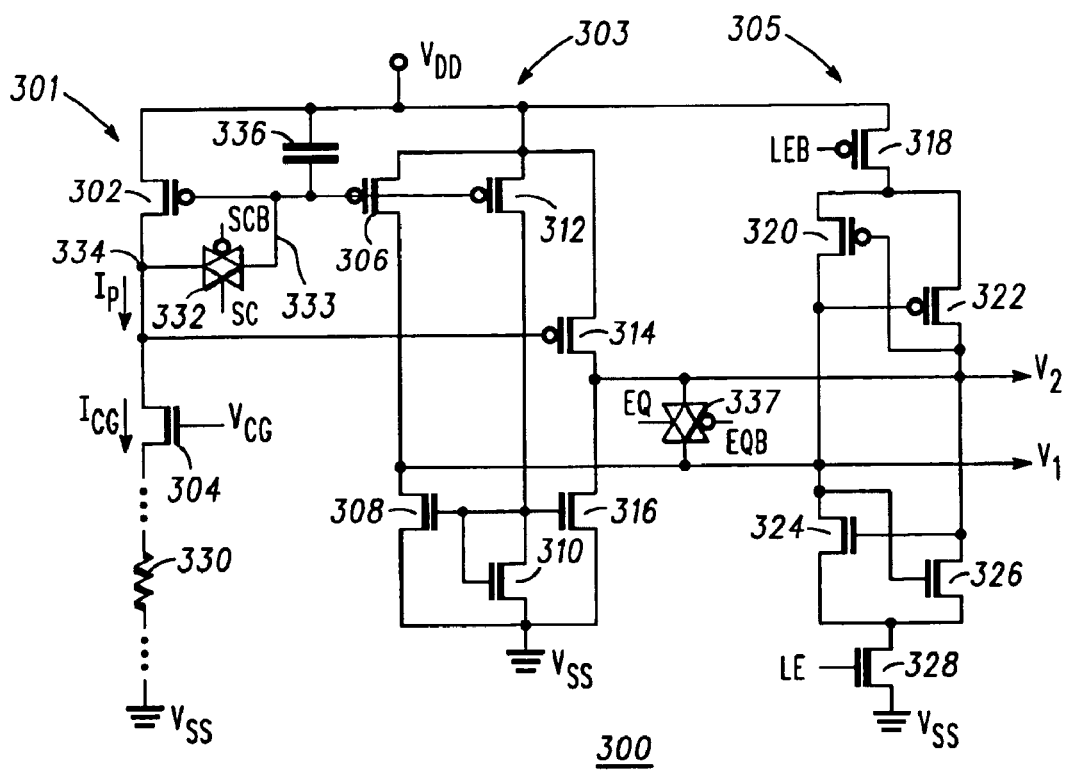
FIG. 40 is a schematic diagram of an apparatus for reading a memory cell (i.e., a sense amplifier) in accordance with a first exemplary embodiment of the present invention.

Referring to FIG. 40, a schematic diagram of an apparatus 300 for reading an MTJ in an MRAM is illustrated in accordance with an exemplary embodiment of the present invention. Generally, the apparatus 300 is a sense amplifier 300 that includes a pre-amplifier 301, gain stage 303, and cross-coupled latch 305. The pre-amplifier 301, which is a current to voltage converter, includes a P-channel transistor 302, N-channel transistor 304, transmission gate 332, and capacitor 336. The gain stage 303 includes P-channel transistors (306,312,314), N-channel transistors (308,310,316) and transmission gates 337. The cross-coupled latch 305 includes P-channel transistors (318,320,322) and N-channel transistors (324,326,328). The apparatus 300 also includes an SCB input configured to receive an SCB signal that is the logical complement of an SC signal presented to an SC input. In addition, an EQB input is configured to receive an EQB signal that is a logical complement of an EQ signal presented to an EQ input, and an LEB input is configured to receive an LEB signal that is a logical complement of an LE signal presented to an LE input. Furthermore, a first voltage output and a second voltage output are configured to present a first output signal (V1) and a second output signal (V2), which are logical complements.

Figure 41:
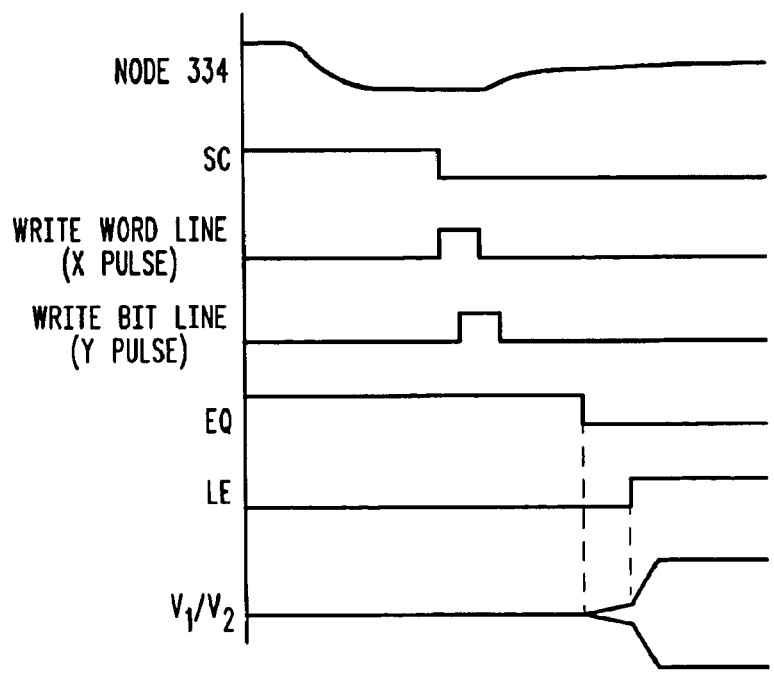
FIG. 41 is a timing diagram for a toggle read operation using the apparatus of FIG. 40.

Referring to FIG. 1, FIG. 40 and FIG. 41, a read operation using the apparatus 300 and a toggle write is illustrated in accordance with an exemplary embodiment of the present invention. An equivalent resistance ($R_{eq}$) representing the equivalent resistance of the ganged memory cell is coupled to the source of the N-channel control transistor 304 via transistors (not shown) that are gated by decoded signals to read the value of the ganged memory cell. For example, the first ganged memory cell 38 is coupled to the apparatus 300 by activating the isolation transistor 184 and control transistor 304 as shown in FIG. 1. The read bit line 192 as shown in FIG. 1 is coupled to the common gate transistor 304 as shown in FIG. 40. The common gate transistor 304 receives a gate bias voltage ($V_{cg}$) resulting in a drain/source current ($I_{cg}$) through the common gate transistor 304. The P-channel transistor 302 sources the preamplifier current ($I_p$) and the P-channel transistor 302 is diode-connected via transmission gate 332 that is enabled during the initial read cycle signified by a high SC signal as shown in FIG. 41. The pre-amplifier 301 develops a steady state bias at a first preamplifier node 334 when the drain-source current ($I_{cg}$) through the control transistor 304 equals the preamplifier current ($I_p$). With the transmission gate 332 enabled, the voltage on a second preamplifier node 333 equals the voltage on first preamplifier node 334, thereby storing the "before" magnetization state on the capacitor 336.

After storing the "before" magnetization state, the transmission gate 332 is disabled with the SC signal swinging low. The value or magnetization state of the memory cell is then toggled by asserting signals on the write word line (WWL) 24 and write bit line (WBL) 40 as illustrated in FIG. 41 and previously described with reference to FIG. 1. This causes the stored value of the memory cell to be toggled from one state to the other state. When the memory cell is toggled, the resistance value of equivalent resistor 330 will either increase or decrease depending on the state before initiating the toggle of the memory cell. The preamplifier responds to the change in the resistance by developing a different voltage on the first preamplifier node 334 (i.e., an increase/decrease in the equivalent resistance will correspondingly increase/decrease this voltage).

The voltage on the first preamplifier node 334 and the stored voltage on the second preamplifier node 333 are applied to the inputs of the gain stage 303 corresponding to the gate of P-channel transistor 314 and the gates of two other transistors (306,312), respectively. After toggling the memory cell, the equalization signals (i.e., EQ signal and EQB signal) are de-asserted causing the transmission gate 337 to become non-conductive and enabling the gain stage 303. The gain stage 303 compares the "before" state bias on the second preamplifier node 333 to the "after" state bias on first preamplifier node 334 and amplifies these biases that provide the first output signal (V1) and the second output signal (V2) as illustrated in FIG. 41. After these two output signals (V1/V2) are developed, which represent the differential voltage signals, the LE signal and LEB signal are asserted to enable cross-coupled latch 305 to amplify and store the first output signal (V1) and the second output signal (V2). The gain stage 303 inverts the signal from the preamplifier state such that an increase in the voltage on the preamplifier node 334 results in a decrease in the second output signal (V2). The gain stage 303 allows the apparatus (i.e., sense amplifier) 300 to sense relatively small voltage changes. In situations where the voltage changes between states or values of the memory cell are relatively large, the use of the gain stage 303 has less relevance.

Figure 42:
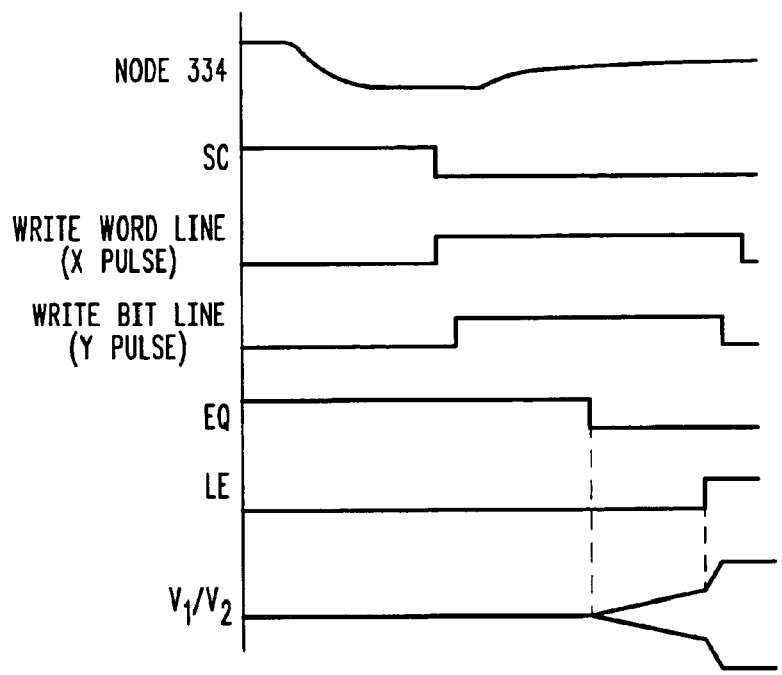
FIG. 42 is a timing diagram for a wiggle read operation using the apparatus of FIG. 40.

Referring to FIG. 40 and FIG. 42, a read operation using the apparatus 300 and a wiggling-toggle write is illustrated in accordance with an exemplary embodiment of the present invention. The order in which the sensing signals are asserted in FIG. 42 is similar to the order described with reference to FIG. 41, except that the signals on the write word line and the write bit line are de-asserted differently to "wiggle" the selected memory cell instead of completing a toggle write. First, the state or value of the memory cell of interest is read or measured before altering the state or value. The "before" value is stored on the capacitor 336. The memory cell is then moved toward the opposite state, which is referred to as a wiggle. As illustrated in FIG. 42, the write word line and then the write bit line signals are asserted to rotate the magnetic field polarization by about ninety degrees (90°) degrees or less to change the resistance of the memory cell of interest. The write word line and write bit line signals are then held for a predetermined amount of time to insure that first output signal (V1) and the second output signal (V2) separate sufficiently for the wiggled value to be latched by cross-coupled latch 305. After the predetermined amount of time, the write bit line signal is de-asserted before the write word line signal is de-asserted to allow the magnetic field polarization to return to the original orientation.

This wiggle operation allows a determination of the resistive value of the memory cell by determining whether the resistance of the memory cell increases or decreases when changed without actually changing the state of the cell. The apparatus 300 effectively performs a comparison to provide a differential between the first output signal (V1) and the second output signal (V2) without changing the state of the memory cell. For example, if the resistance of the memory cell during the wiggle is greater than the resistance "before" the wiggle, then the current state of the cell is a low resistance. If the resistance of the memory cell during the wiggle is less than the "before" resistance, then the present value of the memory cell is a high resistance.

Generally, the apparatus 300 uses a current to voltage converter, a sample and hold circuit, and a latch. The circuit may also include a gain/comparator stage as illustrated in FIG. 40. However, the type of circuit used to perform the sense amplifier functions as discussed herein are not limited to the circuits previously described in FIG. 40. For example, the gain stage 303 may be implemented as a differential amplifier or other type of amplifier appropriate for providing the necessary gain.

Figure 43:
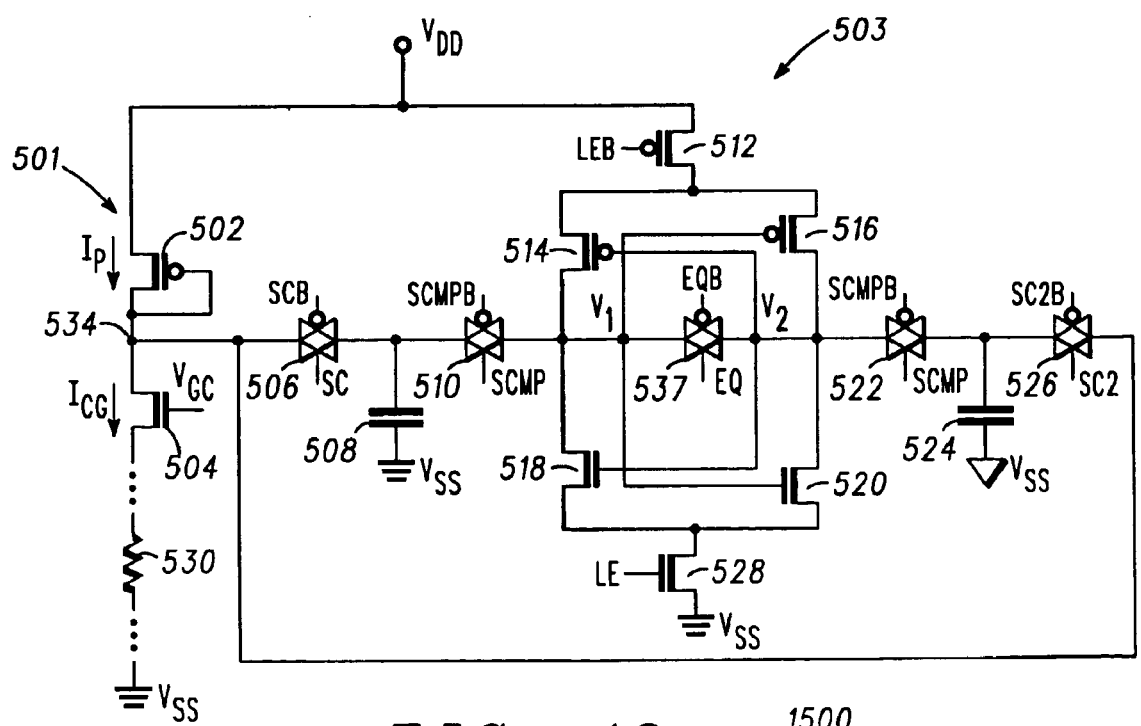
FIG. 43 is a schematic diagram of an apparatus for reading a memory cell (i.e., a sense amplifier) in accordance with a first exemplary embodiment of the present invention.

Referring to FIG. 43, a schematic diagram of an apparatus 500 for reading an MTJ in an MRAM is illustrated in accordance with another exemplary embodiment of the present invention. Generally, the apparatus 500, which is a sense amplifier, includes pre-amplifier 501, cross-coupled latch 503, capacitors (508,524) and transmission gates (506, 510,522,526). The apparatus also includes an SCB input configured to receive an SCB signal that is a logical complement of an SC signal received as an SC input. In addition, an SC2B input is configured to receive an SC2B signal that is a logical complement of an SC2 signal received at an SC2 input, and an SCMPB input is configured to receive an SCMPB signal that is a logical complement of an SCMP signal received at an SCMP input. Furthermore, an EQB input is configured to receive an EQB signal that is a logical complement of an EQ signal received at an EQ input, an LEB input is configured to receive an LEB signal that is a logical complement of an LE signal received at an LE input, and a first output signal (VI) and a second output signal (V2) are logical complements.

The apparatus 500 is similar to the apparatus 300 as described with reference to FIG. 40 and it is intended for use when reading an MTJ in an MRAM as previously described in this detailed description. However, the apparatus 500 is different from the apparatus 300 of FIG. 40 in that separate capacitors are used to store the before and after states or values. The "after" magnetization states or values can be determined by toggling the memory cell or wiggling the memory cell as previously discussed with reference to the apparatus 300 of FIG. 40.

Generally, a read of a memory cell of an MRAM with the apparatus 500 as illustrated includes generating a first voltage of the ganged memory cell having the memory cell of interest and storing this voltage in a first capacitor 508. The memory cell of interest is then toggled to the other value or state. A second voltage of the ganged memory cell having the memory cell of interest is generated and stored in a second capacitor 524. Then the voltage generated by the memory cell before the toggling operation is compared to the voltage generated by the memory cell after toggling by observing how the cross-coupled latch 503 settles. If the "before" voltage is greater than the "after" voltage, then the original state or resistance of the memory cell was a high state or high resistance value. Conversely, if the "before" voltage generated by the memory cell is less than the "after" voltage, then the original state or resistance of the memory cell was a low state or low resistance.

Figure 44:
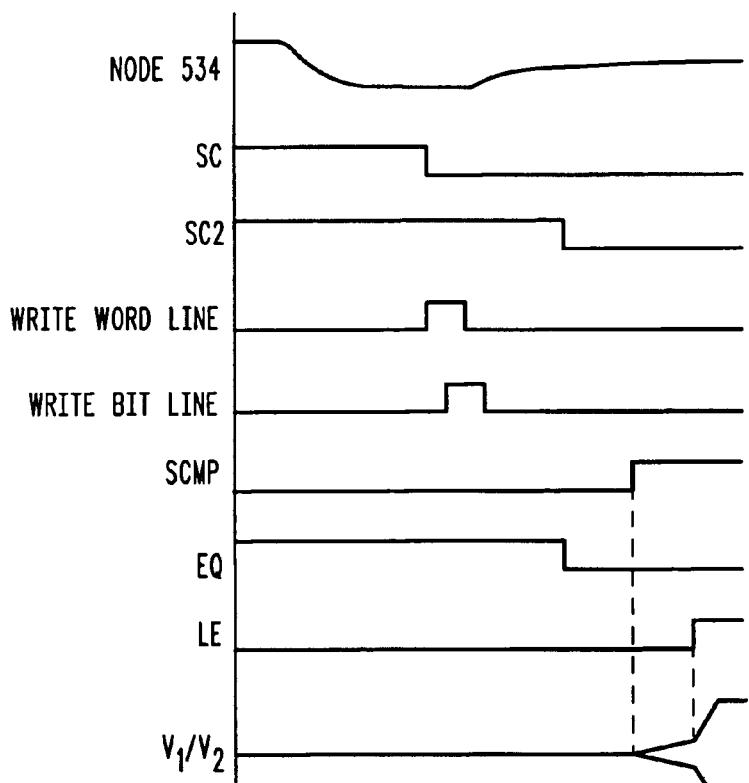
FIG. 44 is a timing diagram for a toggle read operation using the apparatus of FIG. 43.

Referring to FIG. 1, FIG. 43 and FIG. 44, a toggling read operation with the apparatus 500 is illustrated in accordance with an exemplary embodiment of the present invention. During a "toggling" read of MRAM, a ganged memory cell resistance, which is represented by the equivalent resistor ($R_{eq}$) 530 as shown in FIG. 43, is coupled to the source of N-channel control transistor 504 via transistors (not shown) that are gated by decoded signals to read the value of the ganged memory cell. For example, the first ganged memory cell 38 as shown in FIG. 1 is coupled to the apparatus 500 by activating the isolation transistor 184 and common gate transistor 504 as shown in FIG. 43. The N-channel common gate transistor 504 receives a gate bias voltage ($V_{cg}$) resulting in a drain/source current ($I_{cg}$) through the common gate transistor 504. The P-channel transistor 502 is diode-connected to provide a preamplifier current ($I_p$). With transmission gate 506 conductive, the read voltage through the transmission gate 506 is stored on the first capacitor 508. After a predetermined amount of time to allow the voltage at a first node 534 to stabilize, SC signal and SCB signal are de-asserted, causing the transmission gate 506 to be non-conductive. The value or state of the memory cell of interest is then toggled by asserting signals on the write word line 24 and write bit line 40 as illustrated in FIG. 1 and FIG. 44. This causes the stored value of the memory cell of interest to toggle from one unknown state or value to the other unknown state or value. When the memory cell is toggled, the resistance value of the single memory cell will either increase or decrease and consequently the resistance value of the ganged memory cell will either increase or decrease depending on the state before toggling the individual memory cell. The preamplifier 501 responds to the change in resistance by developing a different voltage on the first node 534 (i.e., increasing/decreasing the resistance will correspondingly increase/decrease this voltage). The new voltage on the first node 534 is then stored on the second capacitor 524 via transmission gate 526 after which the SC2 signal and SC2B are de-asserted. After the "before" and "after" voltages are stored on the capacitors (508,524), equalization signals (i.e., the EQ signal and the EQB signal) are de-asserted, thereby causing the transmission gate 527 to become non-conductive. The SCMP signal and the SCMPB signal are asserted to make the transmission gates (510,522) conductive and provide the voltages stored by the capacitors (508,524) to cross-coupled latch 503. The LE signal and LEB signal are asserted to enable cross-coupled latch 503 to store a state or value corresponding to the original state or value of the memory cell of interest. For example, if the "before" voltage stored on the first capacitor 508 is larger than the "after" voltage stored on the second capacitor 524, then the first output signal (V1) and second output signal (V2) of the cross-coupled latch 503 will indicate that the original state or value of the memory cell of interest is larger than the toggled state or value.

Figure 45:
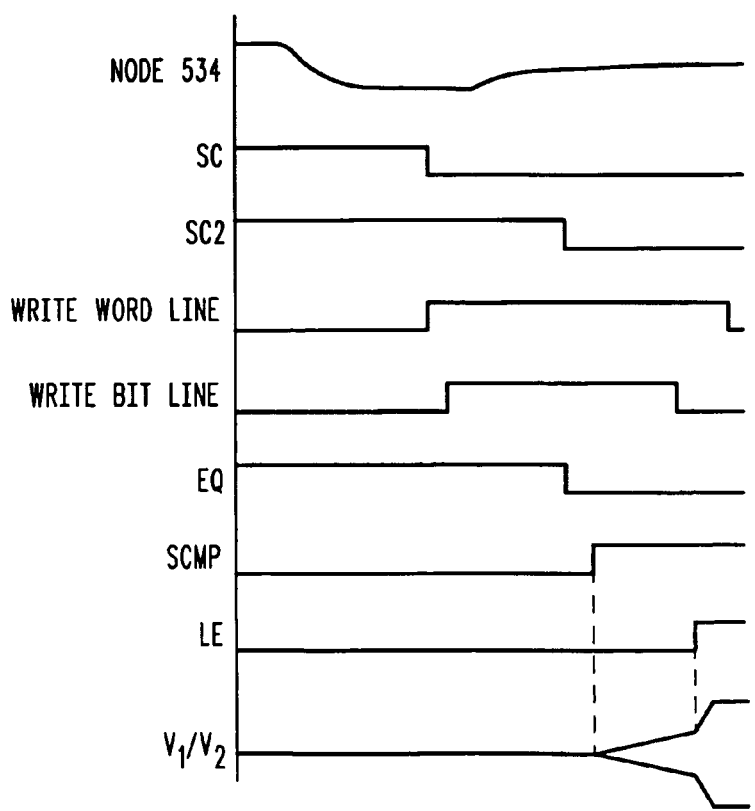
FIG. 45 is a timing diagram for a wiggle read operation using the apparatus of FIG. 43.

As previously described in this detailed description, the original state or value can be determined using a "wiggle" operation, and the apparatus 500 can also determine the original state or value with such a "wiggling" operation. Referring to FIG. 45, an illustrative embodiment is provided for reading an MTJ in an MRAM by wiggling the magnetic polarization of the memory cell (i.e., altering the magnetization state) and sensing the result using apparatus 500. The sequence illustrated in FIG. 45 is similar to the sequence previously illustrated in FIG. 44 except that the write word line and the write bit line signals are applied in an alternate manner to wiggle the memory cell of interest rather than toggle the memory cell state. Initially, the electrical value of the ganged memory cell is read or measured before altering the magnetization state of the memory cell in the ganged memory cell. This "before" value is stored in the first capacitor 508. The memory cell is subsequently rotated toward the other magnetization state and the "wiggled" equivalent value of the ganged memory cell is stored on the second capacitor 524. The write word line signal is asserted, which is followed by an assertion of the write bit line to partially alter the magnetization state of the memory cell (e.g., cause a rotation of the magnetic polarization to about ninety degrees (90°) from the original orientation). The partial alteration changes the resistance of the ganged memory cell of which the memory cell of interest is a part and the difference in resistance can be used to determine the original state as previously described in this detailed description. The write word line and write bit line signals are then held for a predetermined amount of time to ensure that the first output signal (V1) and the second output signal (V2) separate sufficiently for the wiggled value to be latched by the cross-coupled latch 503. After the predetermined amount of time, the write bit line signal is de-asserted before the write word line signal is de-asserted to allow the magnetic field polarization to return to the original orientation. The apparatus 500 effectively performs a comparison to provide a result in the form of differential between the first output signal (V1) and the second output signal (V2). If the "wiggled" resistance value is greater than the "before" resistance value, then the magnetization state or value of the memory cell is a low. If the "wiggled" resistance value is less than the "before" resistance value, then the present magnetization state or value of the memory cell is a high.

There are other write word line signal and bit word line signal combinations that are possible to wiggle the memory cell in accordance with the present invention. For example, a partial rotation of the memory cell, thus a partial change in the resistance of the ganged memory cell, can be obtained by asserting only one of the write lines. The write bit line signal can asserted while the write word line signal is held low. Also, the illustrated embodiment assumes the toggling and wiggling currents are uni-directional. In other embodiments, the toggling and wiggling currents may be bi-directional.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method for reading an MTJ in a ganged memory cell of an MRAM, comprising the steps of:
   determining a first electrical value that is at least partially associated with a resistance of the ganged memory cell;
   toggling the MTJ in the ganged memory cell of the MRAM;
   determining a second electrical value that is at least partially associated with said resistance of the ganged memory cell after said toggling of the MTJ;
   analyzing a difference between said first electrical value and said second electrical value.

2. The method for reading the MTJ in the ganged memory cell of the MRAM of claim 1, wherein said first electrical value and said second electrical values are the net time-rate transference of charge through the ganged memory cell.

3. The method for reading the MTJ in the ganged memory cell of the MRAM of claim 1, said method further comprising the steps of applying a known current to the ganged memory cell of the MRAM.

4. The method for reading the MTJ in the ganged memory cell of the MRAM of claim 3, wherein said determining said first electrical value that is at least partially associated with said resistance of the ganged memory cell comprises measuring a first voltage across the ganged memory cell.

5. The method for reading the MTJ in the ganged memory cell of the MRAM of claim 4, wherein said determining said second electrical value that is at least partially associated with said resistance of the ganged memory cell comprises measuring a second voltage across the ganged memory cell after said toggling the MTJ in the ganged memory cell of the MRAM.

6. The method for reading the MTJ in the ganged memory cell of the MRAM of claim 4, wherein said analyzing a difference between said first electrical value and said second electrical value comprises determining a difference between said first voltage and said second voltage.

7. An MRAM, comprising:

a first memory cell having a first Magnetic Tunnel Junction (MTJ); and a second memory cell having a second MTJ and at least partially forming a ganged memory cell with said first memory cell, wherein the first memory cell and the second memory cell are configured such that a read of the first MTJ comprises:

a determination of a first electrical value that is at least partially associated with a resistance of the ganged memory cell;

toggling the first MTJ of the first memory cell;

a determination of a second electrical value that is at least partially associated with said resistance of said ganged memory cell after toggling the first MTJ; and an analysis of a difference between said first electrical value and said second electrical value.

8. The MRAM of claim 7, wherein said first MTJ and said second MTJ comprise:

a first magnetic region;

a second magnetic region; and a tunnel barrier region interposed between said first magnetic region and said second magnetic region.

9. The MRAM of claim 8, wherein said first magnetic region comprises:

a first ferromagnetic layer;

a second ferromagnetic layer; and a non-magnetic layer interposed between said first ferromagnetic layer and said second ferromagnetic layer.

10. The MRAM of claim 8, wherein said second magnetic layer comprises:

an anti-ferromagnetic layer; and a ferromagnetic layer adjacent to said anti-ferromagnetic layer.

11. The MRAM of claim 7, wherein said first electrical value and said second electrical values are the net time-rate transference of charge through the ganged memory cell.

12. The MRAM of claim 7, said read of the first MTJ further comprises application of a known current to the ganged memory cell of the MRAM.

13. The MRAM of claim 12, wherein said determination of said first electrical value that is at least partially associated with said resistance of the ganged memory cell comprises measurement of a first voltage across the ganged memory cell.

14. The MRAM of claim 12, wherein said determination of said second electrical value that is at least partially associated with said resistance of the ganged memory cell comprises measurement of a second voltage across the ganged memory cell after said toggle of the MTJ in the ganged memory cell of the MRAM.

15. The MRAM of claim 14, wherein said analysis of a difference between said first electrical value and said second electrical value comprises a determination of a difference between said first voltage and said second voltage.

16. A Magnetoresitive Random Access Memory (MRAM), comprising:

a first bit line;

a first memory cell adjacent to said first bit line and consisting of a first Magnetic Tunnel Junction (MTJ);

a second memory cell at least partially forming a first ganged memory cell with said first memory cell and consisting of a second MTJ that is connected in series with said first memory cell; and a first word line adjacent to said first memory cell and said second memory cell.

17. The MRAM of claim 13, further comprising a first plurality of memory cells in addition to said first memory cell and said second memory cell, said plurality of memory cells at least partially forming said first ganged memory cell with said first memory cell and said second memory cell and said plurality of memory cells consisting of an MTJ that is connected in series with other MTJs of said first plurality of memory cells.

18. The MRAM of claim 17, wherein said first MTJ and said second MTJ comprise:

a first magnetic region;

a second magnetic region; and a tunnel barrier region interposed between said first magnetic region and said second magnetic region.

19. The MRAM of claim 18, wherein said first magnetic region comprises:

a first ferromagnetic layer;

a second ferromagnetic layer; and a non-magnetic layer interposed between said first ferromagnetic layer and said second ferromagnetic layer.

20. The MRAM of claim 19, wherein said second magnetic layer comprises:

an anti-ferromagnetic layer; and a ferromagnetic layer adjacent to said anti-ferromagnetic layer.

21. The MRAM of claim 13, further comprising:

a third memory cell adjacent to said first bit line and consisting of a third MTJ;

a fourth memory cell at least partially forming a second ganged memory cell with said third memory cell and consisting of a fourth MTJ that is connected in series with said third memory cell; and a second word line adjacent to said third memory cell and said fourth memory cell.

22. A Magnetoresitive Random Access Memory (MRAM), comprising:

a first word line;

a first ganged memory cell adjacent to a first word line, said first ganged memory cell having a first plurality of memory cells that include a Magnetic Tunnel Junction (MTJ), excluding an isolation device, and connected in series with other memory cells of said first ganged memory cell; and a first bit line adjacent to at least one of said first plurality of memory cells of said first ganged memory cell.

23. The MRAM of claim 19, wherein each of said first plurality of memory cells are connected in series with other memory cells of said first ganged memory cell and exclude parallel connections with other memory cells of said first ganged memory cell.

24. The MRAM of claim 22, further comprising:

a second word line;

a second ganged memory cell adjacent to a second word line, said second ganged memory cell having a second plurality of memory cells that include said MTJ, excluding said isolation device, and connected in series with other memory cells of said second ganged memory cell; and a second bit line adjacent to at least one of said second plurality of memory cells of said second ganged memory cell.

25. The MRAM of claim 24, wherein each of said second plurality of memory cells are connected in series with other memory cells of said second ganged memory cell and exclude parallel connections with other memory cells of said second ganged memory cell.

26. A Magnetoresitive Random Access Memory (MRAM), comprising:

a first word line;

a first memory group adjacent to said first word line, said first memory group comprising a first memory cell coupled in parallel with a second memory cell and said first memory cell and said second memory cell consisting of a Magnetic Tunnel Junction (MTJ);

a second memory group coupled in series with said first memory group to form a first ganged memory cell, said second memory group comprising a third memory cell coupled in parallel with a fourth memory cell and said third memory cell and said fourth memory cell consisting of said MTJ; and a first bit line adjacent to at least one of said first memory cell, said second memory cell, said third memory cell and said fourth memory cell.

27. The MRAM of claim 26, said first memory group further comprises:

a fifth memory cell coupled in series with said first memory cell and coupled in parallel with said second memory cell; and a sixth memory cell coupled in series with said second memory cell and coupled in parallel with said first memory cell.

28. The MRAM of claim 26, wherein said MTJ comprises:

a first magnetic region;

a second magnetic region; and a tunnel barrier region interposed between said first magnetic region and said second magnetic region.

29. The MRAM of claim 28, wherein said first magnetic region comprises:

a first ferromagnetic layer;

a second ferromagnetic layer; and a non-magnetic layer interposed between said first ferromagnetic layer and said second ferromagnetic layer.

30. The MRAM of claim 28, wherein said second magnetic layer comprises:

an anti-ferromagnetic layer; and a ferromagnetic layer adjacent to said anti-ferromagnetic layer.

31. The MRAM of claim 26, further comprising a third memory group coupled in series with said first memory group and said second memory group to form said first ganged memory cell, said third memory group comprising a first plurality of memory cells coupled in parallel and each of said second plurality of memory cells consisting of said MTJ.

* * * * *

UNITED STATES PATENT AND TRADEMARK OFFICE
CERTIFICATE OF CORRECTION

PATENT NO. : 6,909,631 B2
DATED : June 21, 2005
INVENTOR(S) : Durlam et al.

It is certified that error appears in the above-identified patent and that said Letters Patent is hereby corrected as shown below:

Column 20,
Lines 7 and 34, delete "13" and add -- 16 --.

Signed and Sealed this

Sixteenth Day of August, 2005

JON W. DUDAS
*Director of the United States Patent and Trademark Office*